United States Patent
Effros et al.

(10) Patent No.: US 6,771,831 B2
(45) Date of Patent: Aug. 3, 2004

(54) DATA COMPRESSION METHOD AND SYSTEM USING GLOBALLY OPTIMAL SCALAR QUANTIZATION

(75) Inventors: Michelle Effros, Pasadena, CA (US); Dan Muresan, Bucharest (RO)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/298,179

(22) Filed: Nov. 15, 2002

(65) Prior Publication Data

US 2003/0118244 A1 Jun. 26, 2003

Related U.S. Application Data

(60) Provisional application No. 60/332,489, filed on Nov. 16, 2001.

(51) Int. Cl.[7] .......................... G06K 9/38; H04N 11/02
(52) U.S. Cl. ................... 382/251; 375/240.03
(58) Field of Search ............... 382/232, 251, 382/253, 240; 375/240.03, 240.22, 265

(56) References Cited

U.S. PATENT DOCUMENTS

| | | | | |
|---|---|---|---|---|
| 5,640,159 | A | * 6/1997 | Furlan et al. | 341/51 |
| 5,724,453 | A | * 3/1998 | Ratnakar et al. | 382/251 |
| 5,754,236 | A | * 5/1998 | Lee | 375/240.03 |
| 6,118,822 | A | * 9/2000 | Bist | 375/240.03 |
| 6,215,910 | B1 | 4/2001 | Chaddha | 382/253 |
| 6,233,017 | B1 | * 5/2001 | Chaddha | 375/240.12 |
| 6,236,757 | B1 | 5/2001 | Zeng et al. | 382/240 |
| 2002/0141497 | A1 | * 10/2002 | Trovato | 375/240.03 |

FOREIGN PATENT DOCUMENTS

WO 01/15457 A2 3/2001

OTHER PUBLICATIONS

Domaszewicz et al, Design of Entropy Constrained Multiple–Decryption Scalar, IEEE International Symposium on Information Theory, Jan. 17–22, 1993, p 437.*
Brunk et al, Fixed–rate successively refinable scalar quantizers, Proceedings of the Data Compression Conference, Mar. 31, 2003 Apr. 1996, p 250–259.*
Xiaolin Wu et al, On optimal multi–resolution scalar quantization, Proceedings of the Data Compression Conference, 2002, p 322–331.*
Effros et al, Codecell contiguity in optimal fixed–rate and entropy–constrained network scalar quantizers, Proceedings of the Data Compression Conference, 2002, p 312–321.*
Bruce , *An Investigation of Optimum Quantization*, Ph.D. Thesis, M.I.T., Cambridge, MA (May 1964).
Brunk, H., et al., "Fixed–Rate Successively Refinable Scalar Quantizers," *Proceedings of the Data Compression Conferenc*, Snowbird, UT, IEEE, pp. 337–346 (Mar. 1997).
Chou, P.A., et al., "Entropy–Constrained Vector Quantization," *IEEE Transactions on Acoustics, Speech, and Signal Processing*, vol. 37, No. 1, pp. 31–42 (Jan. 1989).

(List continued on next page.)

*Primary Examiner*—Bhavesh M. Mehta
*Assistant Examiner*—Christopher Sukhaphadhana
(74) *Attorney, Agent, or Firm*—Ladas & Parry

(57) ABSTRACT

A signal encoding/decoding system and method are provided, where a signal quantizer is designed by minimizing a target function in accordance with a rate/distortion tradeoff. The system and method can be applied to give lossy compression of data for graphic or music files and also to smart-server applications, in accordance with the available bandwidth.

33 Claims, 3 Drawing Sheets

OTHER PUBLICATIONS

Chou, P.A., et al., "Locally Optimal Variable–to–Variable Length Source Coding with Respect to a Fidelity Criterion", *Proceedings of the IEEE International Symposium in Information Theory*, p. 238 (Jun. 1991).

Cormen, T.H., et al., *Introductions to Algorithms*, 2nd Edition, McGrall–Hill Book Company, 2001.

Effros, M., "Practical Multi–Resolution Source Coding: TSVQ Revisited," *Proceedings of the Data Compression Conference*, Snowbird, UT, IEEE, pp. 53–62 (Mar. 1998).

Effros, M., et al., "Variable Dimension Weighted Universal Vector Quantization and Noiseless Coding,", *Proceedings of the Data Compressio Conference*, Snowbird, UT, *IEEE*, pp. 2–11, (Mar. 1994).

Gray, R.M., et al., "Source Coding for a Simple Network," *The Bell System Technical Journal*, vol. 53, No. 9, pp. 1681–1721 (Nov. 1974).

György, A., et al., "On the Structure of Entropy–Constrained Scalar Quantizers," *Proceedings of the 2001 IEEE International Symposium no Information Theory*, Washington, WA, *IEEE*, p. 29 (Jun. 24, 2001).

György, A., et al., "On the Structure of Optimal Entropy–Constrained Scalar Quantizers,", *IEEE Transactions on Information Theory*, vol. 48, No. 2, pp. 416–427 (Feb. 2002).

Herman, S., et al., "Variable Fanout Trimmed Tree–Structured Vector Quantization for Multirate Channels," *Proceedings of the IEEE Interntional Symposium on Information Theory and Its Applications*, Victoria, British Columbia, vol. 1, pp. 417–421 (Sep. 1996).

Jafarkhani, H., et al., "Entropy–Constrained Successively Refinable Scalar Quantization," *Proceedings of the Data Compression Conference*, Snowbird, UT, *IEEE*, pp. 337–346 (Mar. 1997).

Prandoni, P., "Optimal Time Segmentation for Signal Modeling and Compression," *Proceedings of the IEEE International Conference on Acoustics, Speech, and Signal Processing*, Munich, Germany, vol. 3, pp. 2029–2032 (Apr. 1997).

Proakis, J. G., et al., *Communications Systems Engineering*, Prentice Hall, p. 246 (1994).

Schuster, G.M., et al., "An Optimal Segmentation Encoding Scheme in the Rate Distortion Sense," *Proceedings of the IEEE International Symposium on Circuits and Systems*, Atlanta, vol. 2, pp. 640–643 (May 1996).

Sharma, D.K., "Design of Absolutely Optimal Quantizers for a Wide Class of Distortion Measures," *IEEE Transactions on Information Theory*, vol. IT–24, No. 6, pp. 693–702 (Nov. 1978).

Slepian, D. , et al., "Noiseless Coding of Correlated Information Sources," *IEEE Transaction on Information Theory*, vol. IT–19, No. 4, pp. 471–480 (Jul. 1973).

Vaishampayan, V.A., et al., "Design of Entropy–Constrained Multiple–Description Scalar Quantizers," *IEEE Transactions on Information Theory*, vol. 40, No. 1, pp. 245–250 (Jan. 1994).

Vaishampayan, V.A. , "Design of Multiple Description Scalar Quantizers," *IEEE Transactions on Information Theory*, vol. 39, No. 3, pp. 821–834 (May 1993).

Wu, X. , "Algorithmic Approaches to Optimal Mean–Square Quantization,"Ph.D. Thesis, University of Calgary, Calgary, Alberta (Jul. 1998).

Wu, X. , et al., "Quantizer Monotonicities and Globally Optimal Scalar Quantizer Design," *IEEE Transactions on Information Theory*, vol. 39, No. 3, pp. 1049–1053 (May 1993).

Xiong, Z., et al., "Flexible Time Segmentations for Time-–Varying Wavelet Packet," *IEEE Transactions on Signal Processing*, vol. 3, No. 1, pp. 9–12 (Jan. 1994).

\* cited by examiner

DATA COMPRESSION METHOD AND SYSTEM USING GLOBALLY OPTIMAL SCALAR QUANTIZATION

CROSS REFERENCE TO RELATED APPLICATIONS

This application claims the benefit of U.S. provisional Patent Application Serial No. 60/332,489, filed Nov. 16, 2001 for a "Quantization as histogram segmentation: globally optimal scalar quantizer design in network systems" by Michelle Effros and Dan Muresan, the disclosure of which is incorporated herein by reference.

BACKGROUND OF THE INVENTION

1. Field of the Invention

The present invention relates to a data compression method and system. More in particular, it relates to a method for designing an optimal scalar quantizer to be used in communications or storage systems.

In a communication system, the information to be sent along a channel is usually encoded by means of a source coder, which compresses the data to be sent. The source coder employs a source code that can either be lossless or lossy. A lossless source code is completely reversible, while a lossy source code creates a distortion of the signal to be transmitted. Any lossy source code can be described as a quantizer followed by a lossless compression algorithm. The quantizer performs an approximation step and the lossless compression algorithm performs a lossless compression step.

Quantizers that operate on blocks of source output are called vector quantizers. Quantizers that quantize each output separately are called scalar quantizers. In scalar quantization, each single-source output is quantized to one of some number of levels, and these levels are encoded into a binary sequence. See, for example, "Communication Systems Engineering," John G. Proakis and Masoud Salehi, Prentice-Hall Inc., 1994, p. 246.

For example, the initial source alphabet can be a list of 256 brightness levels numbered from 0 to 255 in a gray scale image. Each symbol can have a certain relative frequency, or probability, so that a list of symbol/probability pairs can be defined, forming a discrete probability function, also known as probability mass function or pmf. A scalar quantizer would approximate the initial source alphabet with a smaller set, for example, the set $\{10, 35, 49, 102\}$ by mapping each number between 0 and 255 to either 10, 35, 49 or 102. A new probability function would arise, given by the relative frequencies of 10, 35, 49 and 102 in the approximation. The "distortion measure" quantities indicate how badly the data is distorted by the chosen mapping.

The output of the quantizer is assumed to go to a lossless compression algorithm, which introduces no further approximations, but produces a more compact representation of the data by taking advantage of its redundancy. The quantizer mapping is chosen with the aim of both keeping the distortion low and allowing a compact representation. The "rate" describes how compact the representation is, with lower rate indicating a shorter data representation. The shorter data descriptions require less memory to store and less time to transmit. Generally, coarser approximations yield higher distortion and lower rate.

There are two important rate measures: in "fixed rate" scenarios, the number of symbols for the approximation is fixed, and each approximation has the same description length. Therefore, the rate does not enter into consideration, and all that remains in quantizer design is the choice of approximation symbols that yield the least distortion, i.e. the least approximation error. In "variable rate" scenarios, the number of approximating symbols is not fixed beforehand and each approximation can have a different description length.

In some systems, an optional initial transform step is provided, where an initial reversible transformation is performed as preprocessing. The code then quantizes the transformed data. The reconstruction process replaces each description by its corresponding reconstruction and then reverses the transformation.

When only one approximation of the original data is given, the quantizer is called a single-description quantizer. However, there is a need to design quantizers not limited to single-description scenarios, but also capable of handling other coding scenarios, like multiple description and multiple resolution coding.

Multiple description refers to the simultaneous production of two or more approximations of the original data. Some approximations are given independent descriptions, while others are reached by combining two or more of the independent descriptions. Reference can be made, for example, to a communications system where more than one path is available, like the case, for example, of one transmitter and multiple receiving antennas. In such case, the different descriptions will travel independently, and some of them may not be received at all.

Multiple description (MD) can be general or restricted. In general-MD, all scenarios are a-priori possible. In restricted-MD, some combinations are known to be impossible. Therefore, in restricted-MD, the sender can make certain assumptions that reduce the number of scenarios to be considered and simplify the code. A special case of restricted-MD is called multi-resolution. In multi-resolution, each description is received only if the previous ones have been received, so that description 3 cannot arrive without description 1 and description 2. A specialized version of the method according to the present invention runs much faster in the multi-resolution case.

Throughout the description of the present invention, reference will be made to the enclosed Annex A, which makes part of the present disclosure. Annex A also contains a reference to twenty prior art publications. The same notation [1]...[20] used for those references in Annex A will be used throughout the description.

2. Description of the Prior Art

Prior art approaches in globally optimal scalar quantizer design for fixed-rate, single-encoder, single-decoder codes for finite-alphabet sources are known. See, for example, references [1], [2], [3], and [4] of Annex A.

A quantizer design algorithm for variable-rate scalar quantization is also known from reference [2] of Annex A, but is very slow.

Additionally, algorithms are known which handle both fixed- and variable-rate, single or multiple descriptions, by iterative methods, where the initial step is that of providing an arbitrary solution and then obtaining a better solution after each iteration. However, these algorithms do not necessarily yield an optimal quantizer, and have no bound on the running time.

Therefore, there is a need for a method for designing an optimal quantizer for signal encoding/decoding which can be applied to the multiple environments described above. Such method must also have a polynomial complexity.

SUMMARY OF THE INVENTION

The present invention overcomes the above limitations and problems by providing a method which finds a quantizer in single-description and multiple-description scenarios with polynomial complexity. Under appropriate conditions, explained throughout the following description, the quantizer is the optimal quantizer. In particular, the quantizer according to the present invention is optimal when it provides the optimum rate/distortion tradeoff. An optimum rate/distortion combination is a combination which makes the rate no larger than some specified allowed value and reduces distortion as much as possible. In particular, the improvement in the quantizer distortion associated with a small increase in rate is matched to a desired target value. The target value is chosen so that the distortion is minimized.

According to a first aspect of the present invention, a signal encoding system having a coder for encoding signals is provided, the coder including a quantizer and a lossless coder, the quantizer producing a distortion on the signals to be encoded, wherein the quantizer is an optimal quantizer under a rate/distortion tradeoff, so that the distortion is minimized when the rate of the optimal quantizer is no larger than a specified value.

According to a second aspect of the present invention, a signal decoding system having a decoder for decoding signals is provided, the decoder including a lossless decoder and an inverse quantizer wherein the inverse quantizer is an optimal quantizer under a rate/distortion tradeoff, so that the distortion is minimized when the rate of the optimal quantizer is no larger than a specified value.

According to a third aspect of the present invention, a signal encoding method for use in a signal encoding system is provided, comprising the steps of: providing a source alphabet containing a set of source characters; approximating the set of source characters by designing a quantizer and applying the designed quantizer to the set of source characters, thus producing a distortion on the set of source characters; and applying a compression algorithm to the smaller set of characters, wherein the step of designing a quantizer comprises the steps of: defining a target function depending on the distortion on the set of source characters; and minimizing the target function.

According to a fourth aspect of the present invention, a client-server system comprising a server and a plurality of clients is provided, wherein when a client of the plurality of clients requests data to the server, the server provides the client with an approximation of the requested data, the approximation being based on a quantization process of the requested data, thus producing distortion on the requested data, the quantization process approximating the requested data to a smaller number of data and comprising a step of designing a quantizer by defining a target function and minimizing the target function.

The method according to the present invention can be applied to a variety of coding scenarios (single-description; general or restricted multiple description; and multi-resolution), under a variety of distortion measures (for example, mean-squared error; absolute error; other monotonic error measures) and under fixed- or variable-rate, in a bounded and reasonable amount of time (polynomial complexity).

According to a first step of the present invention, the quantizer design problem is transformed into a graph problem. In a further step, graph algorithms are used to solve the graph problem; and, in a third step, the graph solution is transformed into a quantizer, which represents the solution to the original problem.

More specifically, in the first step, a weighted directed acyclic graph (WDAG) is built, based on the parameters of the problem. A graph consists of a set of nodes, and a set of edges between nodes. The graph used in the preferred embodiment of the present invention is directed because each edge has an arrow (orientation) on it; weighted because each edge has a weight; and acyclic because there are no circuits.

In the second step, the method according to the present invention uses either the "single-source WDAG shortest path algorithm" or the "all-pairs WDAG shortest path algorithm" to obtain a path between two special nodes of the graph such that the sum of the weights of the edges that make up the path is minimal. Both kinds of the "shortest path algorithm" employ a topological sort algorithm, known as such in the prior art. Finally, the path is "decoded" to obtain a "partition" of the source alphabet. Such partition defines the quantizer.

The quantizer can then be combined with any lossless compression algorithm and optionally with a reversible transformation to yield a lossy compression scheme.

A main advantage of the method and system according to the present invention is that the time complexity of the algorithm it employs is polynomial. The time complexity of an algorithm is the amount of time (or number of steps) it takes to complete, as a function of the size of the input. The input size in the present invention is the number of symbol/probability pairs. The method according to the present invention runs in polynomial time in all embodiments. In the enclosed Annex A the degree of the polynomial is computed for each specific case. It should be noted that the polynomial time complexity of the method according to the present invention is a relevant result, because a brute-force method (examining all quantizers and choosing the best one) will take exponential time, because the number of possible quantizers for N symbols is $2^N$.

A further advantage of the method is that it yields a code that is guaranteed to be the best of all possible codes with "contiguous codecells." For fixed- and variable-rate single description, no other algorithm can yield better codes.

Since the method according to the present invention makes use of a trade-off parameter between rate and distortion, such method is particularly well suited for "smart server" applications where a client requests the data and the server delivers a suitable approximation, based on the available bandwidth, so that more rate and less distortion for large bandwidth, and less rate and more distortion for small bandwidth, are provided.

Examples of applications of the method according to the present invention could include a digital camera, a hand-held scanner, a medical image database or any other image server, where the server or device can store images in an efficient proprietary format internally to maximize usage of its limited memory, and produce a compressed file for download when required.

Additionally, a multiple description quantizer design is useful for "diversity coding" in wireless communications where more than one channel may be available and in packet networks like the Internet.

The quantizer designer method according to the present invention can be used as part of a lossy compression scheme like compression algorithms for images, video and audio. Additionally, the method according to the present invention can work with any kind of discrete-time signal, one-dimensional or multi-dimensional, like for example a sound signal, an image signal, or a time-series signal.

BRIEF DESCRIPTION OF THE DRAWINGS

The present invention will be understood and appreciated more fully from the following detailed description taken in conjunction with the drawings in which.

Annex A, pages A1 to A17, is also enclosed to the present description and forms an integral part of the application as filed.

DETAILED DESCRIPTION OF THE INVENTION

Introduction

Figure 1:
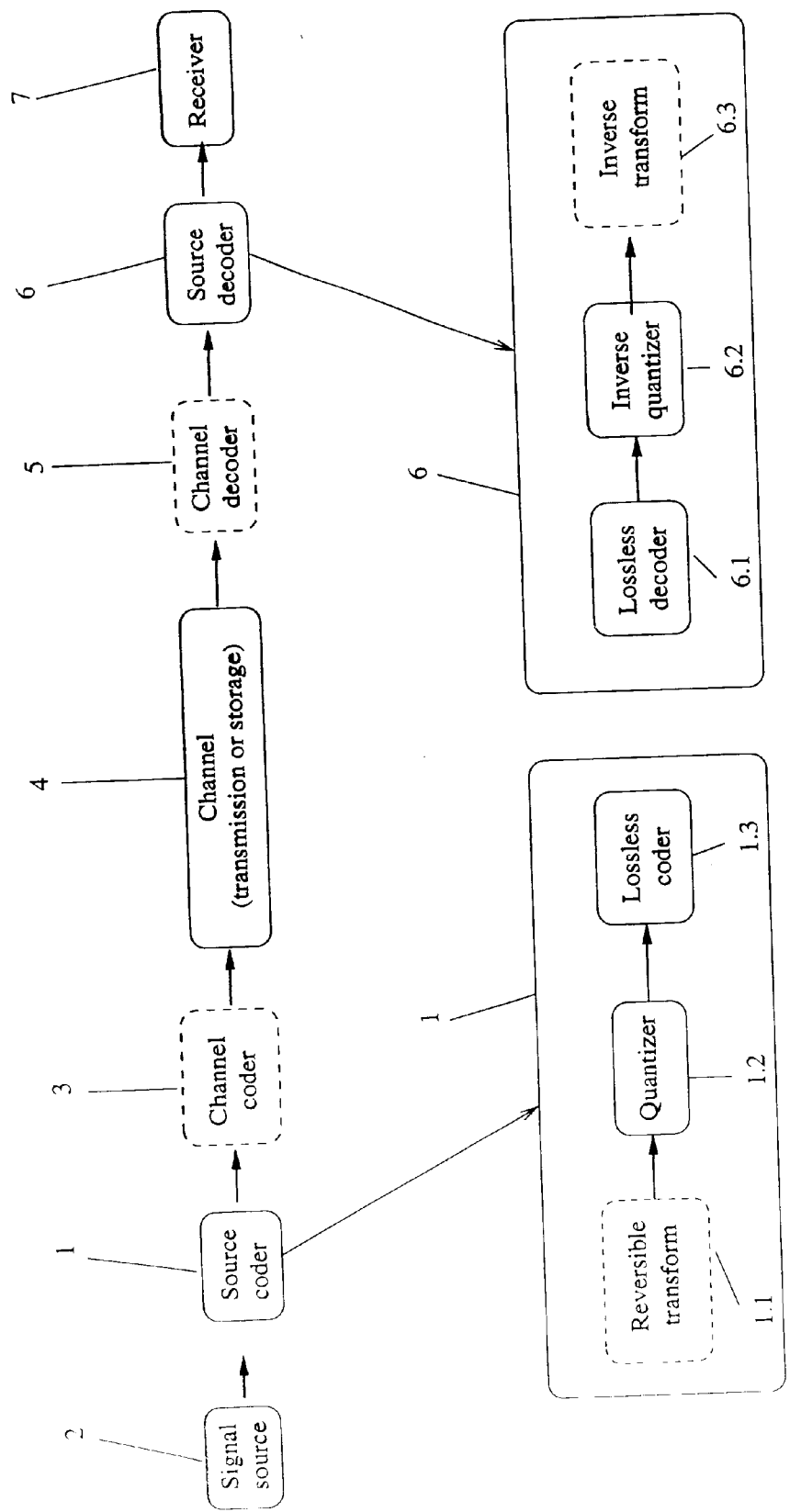
FIG. 1 shows a schematic representation of a digital communication system.

FIG. 1 shows a schematic representation of an encoding/decoding system, like for example a communications system or a storage system. A source coder 1 receives a signal from a signal source 2 and encodes the signal. Once encoded, the signal is optionally fed to a channel coder 3 which further encodes the signal and then input either to a transmission channel 4 or to a storage device, also represented by element 4, like, for example, a memory of a digital imaging or music device. Once the encoded signal has been transmitted or stored, the signal is optionally initially decoded by a channel decoder 5 and then sent to a source decoder 6, which performs an operation which is inverse to the operation of the source coder 1, and finally sent to a receiver 7. The source coder 1 comprises a quantizer 11 and a lossless coder 12, whose input is connected to the output of the quantizer 11. The source decoder 6 correspondingly comprises an inverse quantizer 61 and a lossless decoder 62. Optionally, a reversible transform 13 and an inverse transform 63 are present.

Figure 2:
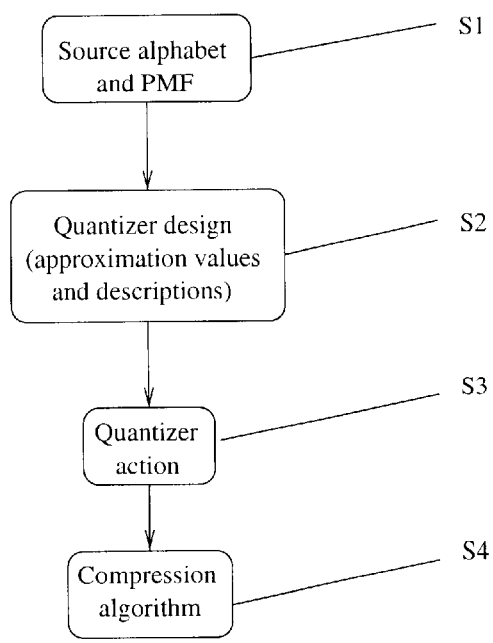
FIGS. 2 and 3 show flowcharts describing the generic operation of the method according to the present invention.
Figure 3:
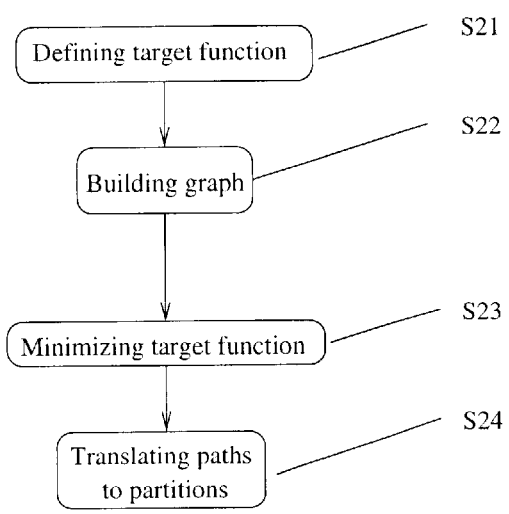

FIGS. 2 and 3 show flowcharts describing the generic operation of the method according to the present invention.

In step S1 of FIG. 2, a source alphabet is provided, corresponding to the signal output by the signal source 2 of FIG. 1. In step S2, a quantizer is designed. In step S3 the designed quantizer is used, by approximating the set of source characters to a smaller set of characters. Finally, in step S4, a compression algorithm, corresponding to the lossless coder 12 of FIG. 1, is applied to the quantizer data.

Steps S21–S24 of FIG. 3 further define the step S2 of FIG. 2. In step S21, a target function is defined. In step S22, a graph, preferably a weighted acyclic graph, is built based on the data of the problem, and in step S23 the target function is minimized by operation on the graph built in the previous step. In step S24, the solution to the graph problem is translated into a solution to the original problem (optimal quantization). Each path between the initial vertex and the final vertex of the partial RD graph corresponds to a partition of the source alphabet, or a set of side partitions for multiple decoder systems. The shortest path corresponds to the optimal partition. The optimal partition uniquely identifies the optimal quantizer.

In single description scenarios (called ECSQ), a path is a concatenation of arcs, and a partition is a concatenation of codegroups. By way of construction, an arc between vertices i and j corresponds to a codegroup comprising symbols i+1 . . . j (or grid cells i+1 . . . j if a "coarse grid" is used to a obtain a fast approximation). This corresponds directly to the optimal partition once the shortest path is known. For example, the Figure at page A4 of Annex A shows that the path 0→2→3 corresponds to the partition {{1,2}, {3}}.

For multiple description scenarios, each vertex contains a "tuple" (i.e. pair, triplet, 4-tuple, 5-tuple etc.) of labels. For example, in a 3DSQ scenario, each vertex contains three labels. For variable-rate general-3DSQ, these labels will be integers. For restricted-3DSQ or for fixed rate codes, each label might in turn be a pair or triplet of integers, and will be called "double-labeling."

In the 3DSQ scenario, each of the three labels per vertex will contain one integer which is important—the "end-of-codegroup" counter. Additionally, each label may contain a "beginning-of-codegroup" counter for restricted-3DSQ, and a "number-of-codegroups" counter for fixed rate codes. To obtain the three side partitions corresponding to the three descriptions, a list of the "end-of-codegroup" counters of the vertices in the path is written down, for example:

0 0 0
1 0 0
1 2 0
1 2 1
3 2 1
3 3 1
3 3 3

By looking down the columns, three paths are obtained: 0→1→3 for the first column, which means that the first side partition (for the first partition) is {{1}, {2, 3}}, like in the ECSQ case. The second column reads 0→2→3, which means that the second side partition (for the second partition) is {{1, 2 }, {3}}. Finally, the third column gives 0→1→3 and the third side partition {{1}, {2, 3}}. It should be noted that in each step, only one of the three paths is extended (in terms of the original problem, only a single side codegroup is added to one of the side partitions, according to the "extension rule"). Thus column one which looks like 0 1 1 1 3 3 3 should be read as 0→1→3 as done previously.

Figure 4:
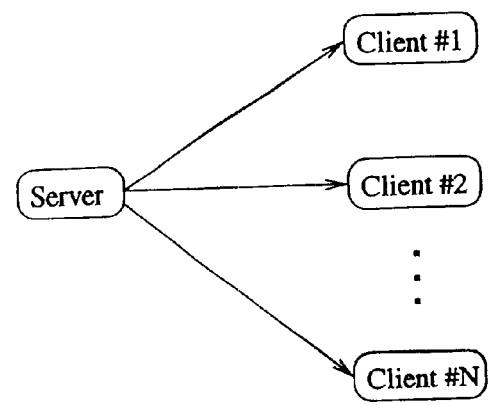
FIG. 4 shows a generic client-server environment, to which the present invention can be applied.

FIG. 4 shows a generic client-server environment to which the present invention can be applied.

The following description will explain, in detail, steps S21 to S24 of FIG. 3.

Problem Set-Up

In prior art fixed-rate coding, the number of codewords is fixed, all codewords are described at the same rate, and the design goal is to minimize the code's expected distortion with respect to a given probability mass function (pmf) or training set. See references [1], [2], [3], and [4] cited in Annex A.

The method according to the present invention will assume the distortion measure to be non-negative, and the expectation relating to the expected rates to be taken relative either to a known pmf on a finite alphabet or to a finite training set on an arbitrary alphabet. The alphabet will be written as 1 . . . N and the histogram describing the known pmf or the empirical estimate based on the training data will be denoted by a histogram p[1] . . . p[N].

Once either a quantizer encoder or a quantizer decoder is designed, optimization of the remaining portion is straight-forward. The present invention will focus on the design of a quantizer encoder. The quantizer encoder according to the present invention will be able to be applied not only to single-resolution scalar quantizers, but also to multi-resolution and multiple description scalar quantizers. Although design of a quantizer decoder will not be described here in detail, such design will be straightforward for the person skilled in the art upon reading of the present description.

Designing an encoder on a finite alphabet is equivalent to designing one or more partitions on the source alphabet 1 . . . N, where each set in a partition describes a codegroup, i.e. all symbols given the same binary description. A traditional scalar quantizer encoder requires one partition. An M-description scalar quantizer encoder uses M partitions, one for each description. An M-resolution scalar quantizer encoder similarly requires M partitions.

The method according to the present invention finds, in each coding scenario, the optimal quantizer among all quantizers with contiguous codecells. The collection of allowed indices to which the space of possible data values is mapped by the quantizer is a set of reproduction values, called codewords. The set of codewords is called a codebook. The set of alphabet symbols that are mapped to a certain codeword is called the codecell associated with that codeword. When the source alphabet is a discrete subset of some continuous alphabet, the discrete codecells are called codegroups.

A quantizer with contiguous codecells will be called a regular quantizer. See the section "Codecell Contiguity" of Annex A, page A2. See also section VII of Annex A, pages A14–A17, where a more detailed discussion on the relationship between true optimality and regular or non-regular quantizers.

The discrete probability function is represented by histogram $p[1] \ldots p[N]$. Given the contiguity assumption, each codegroup on the source alphabet corresponds to a segment on the probability signal. Since the performance of a partition (measured by the expected rate and distortion of the corresponding quantizer encoder and its optimal decoder) is a function of the probability signal, the partition-design problem on alphabet $1 \ldots N$ can be treated as a segmentation problem on signal $p[1] \ldots p[N]$, as also indicated in the section "Segmentation and Quantization" of Annex A, page A2. In particular, the optimal quantization problem can be cast as an instance of optimal segmentation on an abstract probability signal represented by signal $p[1] \ldots p[N]$.

According to an embodiment of the present invention, the size of the problem can be reduced by grouping alphabet symbols together in larger sets, called grid cells. See also the section "Fast Approximations" of Annex A, pages A2–A3, where N indicates the number of alphabet symbols, and $\tilde{N}$ indicates the number of grid cells. The size of the problem is reduced at the cost of approximate results. True optimality is obtained when $N=\tilde{N}$.

1. Single-Encoder Quantization

Fixed rate quantization has already been defined in the introductory portion of the present application. Fixed rate problems are currently being solved by use of a source coding paradigm, as shown, for example, in references [1], [2], [3] and [4] of Annex A.

The present invention improves the prior art by providing a method which applies a variation of the traditional source coding paradigm also to variable rate scenarios, thus extending application also to environments where the number of the approximating symbols of the quantizer is not fixed beforehand and descriptions of different lengths are allowed, allowing application to a broader set of communication systems and better performance.

In a first step, the target of the optimization is defined. Such target is a function to be minimized, as shown by the Lagrangian J in equation (1) of the section "Optimization Criterion" of Annex A, page A3. Minimization of the Lagrangian J will allow the best quantizer to be obtained. Rate and distortion are broken down into a sum of per-codegroup partial rates and partial distortions, in order to transform the optimal quantization problem, i.e. the minimization of the Lagrangian J, into a graph problem, as shown in the same section of Annex A.

As already noted above, the use of a Lagrangian multiplier introduces a rate/distortion tradeoff on which the minimization problem according to the present invention is based. In the prior art, a tradeoff between rate and distortion is not specified and cannot be determined. Rather, a bound on rate or distortion is given. This bound is usually called "rate budget" and defines the maximum available rate or alternatively the maximum acceptable distortion.

Rate/distortion problems are presently very common, because of the explosion of the digital media. For example, when saving an image, there is usually a choice of low, medium or high compression. The higher the compression, the lower the rate (i.e. the file size) and the higher the distortion. Another example is given by cell phone technology: with a large bandwidth, more "rate" can be used and the speech sounds better. With a short amount of bandwidth, "low-rate" codes have to be used, which approximate the voice signal in order to send less information (bits) per unit time. In a storage scenario, the rate is measured in bits/sample. A sample could be, for example, a pixel of an image. For uncompressed black-and-white images (fax images), one bit per pixel would be needed (1=black, 0=white). For uncompressed grayscale images, 8 bits/pixel would be needed (from 0=darkest to 255=lightest). For a sound file, a sample would be the instantaneous level of the waveform. For example, a triangular waveform would have samples 0,1,2,0,1,2 . . . etc. In a transmission scenario, the rate is also measured in bit/sample, but sometimes also a bit/second measurement is used.

In the minimization step according to the present invention, various multipliers are tried, so that various rate/distortion combinations are generated, until the best rate/distortion combination is determined for a particular application.

In a second step, a relation between the problem of signal segmentation and the single-source shortest path problem in a weighted directed acyclic graph (WDAG) is obtained. Such step is known as such. See, for example, reference [6]. In particular, given the probability histogram $p[1] \ldots p[N]$ and a predetermined cost measure, the optimal quantization problem can be cast as an optimal segmentation problem on the histogram $p[1] \ldots p[N]$. Equivalence between optimal segmentation problems and the shortest-path graph is known as such, as also shown in references [7]–[11].

In a third step, a minimization algorithm is applied, corresponding to the optimal segmentation algorithm. The optimal segmentation algorithm according to the present invention is equivalent to the shortest-path algorithm on a WADG called the "partial rate-distortion (RD) graph," as explained in the section "Segmentation and Shortest Path Problems" of Annex A, pages A3 and A4. In particular, for every pair (u,v) with u<v there is an arc (directed edge) from u to v. The arc corresponds to a codegroup comprising cells u+1 . . . v and the weight is the Lagrangian cost $d(C_{u+1\ldots v})+\lambda r(C_{u+1\ldots v})$. In the same section, the duality between edge and codegroups, and consequently between paths and partitions, is explained. This follows from the fact that paths are made up of edges and partitions are made up of codegroups.

The section "Algorithms" of Annex A, pages A4 and A5, describes the shortest-path algorithm and the topological sort algorithm which are applied to minimize the Lagrangian J. Such algorithms are known as such, and do not need to be described more in detail than already done at pages A4 and A5. See, for example, reference [12].

2. Multiple-Decoder Systems

The above embodiment can also be generalized to source codes designed for more general network scenarios.

In multiple decoder systems several descriptions are sent independently, and each description may or may not be received. Examples of single-source, multiple-decoder systems include multiple description scalar quantizers and multi-resolution scalar quantizers.

In multiple description scalar quantization (MDSQ), the source description is broken into a collection of packets, and reconstruction under any combination of received and lost packets is required. MDSQ is useful in diversity systems, where the encoder sends separate descriptions of the source over M different channels and reconstruction is required using the successfully received descriptions. MDSQ is also useful for packet-based communication systems and distributed data storage systems, where reconstruction of the data using a subset of the original set of source descriptions may be required.

Multi-resolution scalar quantization (MRSQ) is useful in applications where the compressed data sequence is intended for multiple users with differing rate and reproduction quality needs. In MRSQ, embedded source descriptions are used. The embedded source description may be decoded in part or in whole, with an expected reproduction quality that improves as a function of the rate of the decoded sequence. Since the binary description may be decoded at a variety of rates, the MRSQ decoder effectively contains a collection of decoders, one for each rate at which the binary sequence may be decoded.

MRSQ is a special case of MDSQ where decoders are designed for a subset of the possible packet-loss scenarios rather than all packet-loss scenarios. Therefore, an optimal MDSQ design algorithm leads to an optimal MRSQ design algorithm.

In the following, the description will initially focus on variable-rate MDSQ design with M=2, which will be indicated as 2DSQ. The M>2 scenario will then follow.

2A. Set-Up of the 2DSQ Method

The encoder of a 2DSQ gives two separate data descriptions and is therefore defined by two distinct partitions, P1 and P2, of the alphabet. The two descriptions can either be received alone or simultaneously. If the two descriptions are received alone, the problem reduces to ordinary single-description (SD) quantization with partition P1 and P2. Should the descriptions be received simultaneously, a new partition P0, called central partition, is defined, which contains codegroups pertaining both to the first and the second partition P1, P2, called side partitions.

Based on the central partition P0 and the side partitions P1 and P2, a target function is defined, which will be used as the optimization criterion for partition design in variable-rate 2DSQs. For a more detailed disclosure of the target function, see the section "Set-Up" of Annex A, pages A5 and A6.

2B. Solution of the 2DSQ Method

The method according to the present invention jointly optimizes the two side partitions P1 and P2, also keeping track of the central partition P0, which is a dependent function of the two side partitions P1 and P2.

First of all, a partition-set interpretation of the vertices in a 2DSQ scenario is provided. In a one-dimensional scalar quantization (SQ), each vertex represents a set of partitions that spans the cell range 0–v. In 2DSQ, vertex labels are pairs (vi, vj) and vertex (v1, v2) represents a set of partition pairs (P1, P2) such that P1 spans the range 0–v1 and P2 spans the range 0–v2.

When building the edge set, only one side partition may be extended at a time, thus only one side codegroup is added by each arc. Therefore, in principle, there should be an arc from vertex (v1, v2) to all vertices (v1', v2) and (v1, v2') such that v1'>v1 and v2'>v2. The difficulty arises when we attempt to assign weights to the edges. Some partitions must not be represented in their associated vertex and to guarantee that exclusion, some edges must be removed from the graph.

Computation of the central partition P0 is straightforward for side partitions having equal length, i.e. vertices (v, v). See FIG. 3 of Annex A and related discussion in Annex A. However, when the side partitions have different lengths, the central partition can be determined only up to the end of the shorter side partition. See FIGS. 5 and 6 of Annex A, and relative explanation at pages A6 and A7.

The consequence of ambiguity in the central partition definition is a corresponding difficulty in assigning weights to the arcs of the graph. In particular, while each arc corresponds to a single codegroup being added to one of the side partitions, the same arc corresponds to one or possibly multiple codegroups being added to the central partition. To be able to assign a unique weight to that arc, the total Lagrangian cost of the newly added codegroups must be the same regardless of the "internal structure" of the partition being extended. That is, the Lagrangian cost must be a function only of the labels of the two vertices that it joins. The codegroup added to one of the side partitions is clearly determined by the two vertex labels only, but the central codegroups are not, in general.

The inventors have successfully noted that the problem seems to arise from the fact that one of the side groups is "too short" relative to the other. Therefore, the inventors have developed a method to keep side partitions more "even" to avoid this type of problem. In particular, a "codegroup lag" has been defined, where partition P1 "lags" partition P2 by L codegroups if there are L codegroups on P2 not lying entirely inside the range covered by P1.

Therefore, the method according to the present invention keeps the codegroup lag between the two side partitions at most 1. A lag of zero will mean that the partitions are of equal total length. A partition pair having a codegroup lag less than or equal to 1 will be called valid.

Once the weight on each arc is defined as the Lagrangian cost associated with one new side codegroup and one new central codegroup, the above condition will allow a single weight to be defined for each arc.

The validity condition guarantees that adding side codegroups results in predictable central codegroups being generated. The following step of the method according to the present invention will be that of constraining the partial RD graph to obey the validity condition.

The method according to the present invention keeps partition pairs with codegroup lag more than 1 unrepresented in the vertices of the graph. Since the partition pairs represented in each vertex are defined by the paths between (0,0) and that vertex, removing arcs from the graph will be enough to eliminate the undesired paths.

The Partition Extension Rule

Figure 5:
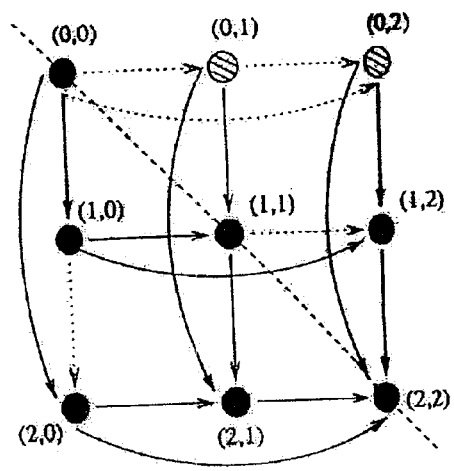
FIG. 5 shows a graph and a partition extension rule used in solving the 2DSQ method.

FIG. 5 of the present application (corresponding to FIG. 4 of Annex A) shows the partition extension rule used in solving the 2DSQ method. When v1 differs from v2, only the shorter side partition will be extended. When v1 equals v2 one of the two side partitions will be extended, for example P1. In this way some of the vertices are excluded. With reference to FIG. 5:

in vertex (0, 0) v1=v2. Therefore, arcs connecting (0,0) with (1,0) and (2,0) will be generated;

in vertex (1,0) v2 (=0) is shorter than v1(=1). Therefore, arcs connecting (1,0) with (1, 1) and (1, 2) are generated;

in vertex (1, 1) v1=v2. Therefore, an arc connecting (1,1) with (2,1) is generated;

in vertex (2,1) v2(=1) is shorter than v1(=2). Therefore an arc connecting (2,1) with (2,2) is generated;

in vertex (1,2) v1(=1) is shorter than v2(=2). Therefore an arc connecting (1, 2) with (2,2) is generated; and in vertex (2,0) v2(=0) is shorter than v1(=2). Therefore, arcs connecting (2,0) with (2,1) and (2,2) are generated.

It follows that some arcs are eliminated and some vertices become inaccessible from (0,0) so that they cannot be visited. In general, all vertices of the form (0,v2) with v2>0 are excluded. In FIG. 5, vertices (0,1) and (0,2) are excluded.

The next step will be that of assigning a weight to each arc from (v1, v2) to (v'1, v'2). The weight on each arc is defined as the Lagrangian cost associated with one new side codegroup and sometimes one new central codegroup as explained at page A7 of Annex A. This is done according to the following criteria:

when v1=v2=v'2 (vertical arc starting from partitions having the same length) an additional codegroup is added to P1 and no codegroups are added to P0;

when v2=v'2>v1 (vertical arc starting from partitions having different lengths) an additional codegroup is added to P1 and one codegroup is added to P0; and when v1=v'1>v2 (horizontal arc starting from partitions having different lengths) an additional codegroup is added to P2 and one codegroup is added to P0.

In this way, a partial RD graph has been built for the 2DSQ case. The subsequent step will be that of running one of the prior art shortest path algorithms described in the sections above, which will yield the optimal 2DSQ with contiguous codecells.

2C. Extension from 2DSQ to MDSQ

In the following, 2SDQ will be generalized by allowing M>2 quantizers to be designed jointly for M separate descriptions that travel independently. An MDSQ with M descriptions may be described by M side partitions which induce $2^M-M-1$ non-trivial intersection partitions. The intersection partitions are the analogues of the central partition P0 from the 2DSQ scenario.

In this section, it will be assumed that the packet-loss scenarios corresponding to all of these intersection partitions occur with nonzero probability and thus that all are constrained. That assumption will be relaxed later.

Each possible packet-loss scenario can be described by a binary vector of length M, called the packet-loss vector; in this vector, bit i is 1 if packet i is received and 0 if packet i is lost in the corresponding scenario. Therefore, a packet-loss vector encodes information about a particular combination of lost and received descriptions. For example, packet-loss vector (1101) describes the scenario where, of an initial set of 4 packets, all but packet 3 are received. Side and intersection partitions can be indexed according to the same scheme. For example, P(0010) is the side partition used to describe packet 3 out of 4, while P1101 is the intersection partition corresponding to combined knowledge of packets 1, 2, and 4.

Also in this case a target Lagrangian function to be minimized, is described, as shown in Annex A, section "Extension from 2DSQ to MDSQ", pages A8 and A9. In particular, the target is redefined to balance the performance of the side partitions and the intersection partitions. In the same section the graph construction is generalized by generalizing the partition extension rule and the arc weight definitions. Here, vertices are not just pairs, but M-tuples of integers since they must keep track of the growth of M side partitions. In the present scenario, the partition extension rule specifies which partition may be grown for any M-tuple, and also identifying a criterion for "breaking ties", where the competitor with the smallest index is chosen.

As shown in Annex A, the details of implementing the shortest path algorithm for these particular graph structures are worked out. In case an ancestor-based version of the shortest path algorithm is implemented, as shown in the Annex A, the ancestor set of each vertex for the ancestor-based shortest path algorithm is explicitly computed. Should other versions of the shortest-path algorithm be used, the ancestor set is not required.

Also in this case, the method has a polynomial complexity as established in Annex A, page A9.

2D. Fixed-Rate MDSQ

In fixed-rate MDSQ design, the sizes of the side partitions are fixed and the rate of each description equals the logarithm of the corresponding size of the side partition. The generalization of the above method to fixed-rate MDSQ is described in the section "Fixed-Rate MDSQ" of Annex A, at page A9. In particular, the graph structure is refined to solve the fixed-rate version of the optimal quantization. In the present scenario, the vertices of the graph will also keep a count of how many segments each partition contains, so that a "double labeling," one for the partition boundaries and one for the segments contained, is employed. In particular, each vertex is labeled with a tuple of M pairs of integers, for a total of 2M integers. Since rate is fixed, the Lagrangian cost incorporates only distortions.

In the following 'MRSQ' and 'Restricted MDSQ' sections, the admissible scenario set will be introduced, namely the set of possible combinations of received/lost descriptions. If some descriptions cannot be received without others, they may be encoded with less rate, so that the objective function for the optimization changes and new algorithms are employed.

2E. MRSQ

An overview of the MRSQ and a definition of the target function to be minimized is given in the section "MRSQ Overview" of Annex A, at page A10. In particular, multi-resolution coding is introduced and rate requirements are computed. In this case, a recursion relation for the target function is developed, which relation leads to a specialized MRSQ algorithm.

A detailed description of the method is given in the section "Algorithm" of Annex A, at pages A11 through A13. In particular, the recursion relation for the target function is exploited to formulate a multi-level dynamic programming algorithm. The algorithm starts at the lowest resolution level and builds a new set of weights at each level based on running an "all-pairs shortest-path" on the weights from the level directly below.

2F. Restricted MDSQ

Here, the most general case is treated, where a flexible set of dependencies can operate on the M descriptions. For example, a set of dependencies could be "description 3 cannot be received without 1 and 2, and description 5 cannot be received without 2 and 3." A simple application implementing the concepts of the present section could provide, for example, a combination of two independent multi-resolution channels, like a 2DSQ using one 2RSQ and one 3RSQ. Three steps are followed:

1] Dependencies are extracted from the admissible scenario set;

2] Indirect dependencies are eliminated. For example, if 3 depends on 2 and 1, and 2 depends on 1, then the dependency of 3 on 1 can be eliminated.

3] The descriptions are then renumbered by sorting them topologically, according to the dependency graph.

With reference to dependencies and refinement, it is also noted that dependency between descriptions/packets does not necessarily imply refinement between corresponding side partitions, as shown at page A12 of Annex A. However, the inventors have proved that imposing refinement relationships between side-partitions corresponding to dependent descriptions causes no loss of generality: for any set of non-complying side partitions P', another set of side partitions P can be constructed such that 1] The sets of intersection partitions generated by P and P' are identical on the admissible scenario set;

2] P complies with the refinement requirement for side-partitions corresponding to dependent descriptions.

Once it is ensured that dependents are never extended beyond the boundaries of their requisites, refinement is preserved. This modification of the extension rule can be implemented directly also with the available general-MDSQ partial RD graph structure.

However, the partial RD graph structure has to be changed in order to assign weights to edges involving extensions of dependent descriptions. In order to compute the partial rate for a codegroup in a dependent partition, the "parent" codegroup in the requisite partition must be known. The end of that parent codegroup is recorded in the graph structure, but the beginning of the parent codegroup is not recorded yet. Thus, the vertices of the graph must be "double-labeled" to include the beginning, as well as the end, of codegroups in requisite partitions. If fixed-rate is also desired, this amounts to "triple-labeling" of the vertices: beginning of last codegroup, end of last codegroup, and number of codegroups. For partitions which are not requisites of any other partitions, this information is not necessary. New codegroup weights for dependent descriptions, which make use of the extra information available in requisite partitions, are derived. Because dependent packets are always received in the company of their requisites, more efficient encoding is possible.

Restricted-MDSQ can be combined with fixed-rate. It can be noted that any and all partitions may be designated as either fixed or variable rate. Thus, single-labeled, double-labeled and triple-labeled partitions may be present in the same graph.

3. Decoder Side-Information

The section 'Decoder side-information' (SECSQ) of Annex A, pages A13 and A14, treats the case when the decoder or receiver has access to both A] what was transmitted by the encoder or sender and
B] a random variable Y correlated with the source X.

Figure 6:
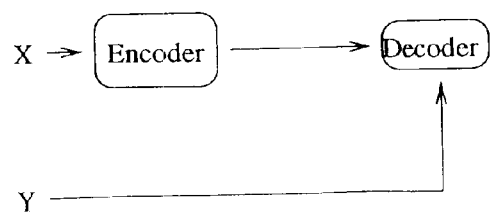
FIG. 6 shows a schematical representation of the "decoder side-information" scenario.

Of course, the receiver does not have access to X directly, as shown in FIG. 6. There are two independent paths through which the source message X is communicated to the decoder: the encoding of X provided by the sender, and the message Y which is correlated with X. The decoder knows the joint distribution of X and Y, i.e. the individual probability that X=x and Y=y for all pairs <x,y>.

For example, suppose X is the temperature in New York (in Fahrenheit, with 1-degree precision), the sender is located in New York, and the receiver is in Los Angeles. The sender describes X to the receiver using some quantizer, e.g. by using 10 degree increments: if X is between 50 and 60, the sender encodes it as 55; if X is between 60 and 70, the sender encodes it as 65 etc. Further suppose that, for some reason, the decoder has access to Y, the last digit of X (3 for 63, for example). By combining knowledge from the received approximation of X and from Y, the decoder can tell exactly what X was (most real-world examples would not be as dramatic). In this example, the joint probability for <x, y> is simply 1 if y is the last digit of x and 0 otherwise. The source alphabet is 0 . . . 100, and the side-information alphabet is 0 . . . 9.

At pages A13 and A14 of Annex A, the inventors prove that in the case of SECSQ (ECSQ with side information) the same partial RD graph structure can be used, but with modified weights, to obtain the optimal quantizer. Annex A also shows how speed-up techniques used to reduce the computational complexity of determining ECSQ weights translate directly to the SECSQ problem, the only modification being that the preprocessing techniques must be repeated N(Y) times, where N(Y) is the size of the side-information alphabet.

Furthermore, for multiple-decoder with side information systems, the same pattern applies: keep the graph structure from no-side-information versions, but use the partial RD formulas and speed-up techniques developed for SECSQ.

4. Codecell Contiguity

Pages A14 to A17 of Annex A discuss whether and when the quantizer regularity restriction (i.e. the requirement of codecell contiguity) precludes true optimality. The following conclusions are reached:

1] Fixed-rate optimal ECSQs (entropy-constrained scalar quantizers) always use contiguous codecells for distortion measures that are non-decreasing functions of the absolute error, see Theorem 1 at page A14 of Annex A. Also the mean-squared error (MSE) is included in this class of distortion measures.

2] For variable-rate ECSQs, two further constraints must be imposed to guarantee contiguous codecells, see Theorem 2 at page A14 of Annex A:
  a] The distortion measure must be a convex function of the absolute error, not just non-decreasing. MSE satisfies this condition.
  b] Contiguity is claimed only for points on the lower convex hull of the rate-distortion curve. However, this kind of constraint is somewhat academic, because Lagrangian-based optimization only sees points on the convex hull anyway.

3] Fixed- and variable-rate MRSQ, MDSQ (general or restricted) and SECSQ (side-information ECSQ) may require non-contiguous quantizers, regardless of the distortion measure. See also Theorem 5 at page A16 of Annex A.

4] For MRSQ with the MSE distortion measure, while the finest partition has to be contiguous in an optimal quantizer, the coarsest partition can be non-contiguous.

While several illustrative embodiments of the invention have been shown and described in the above description and in the enclosed Annex A, numerous variations and alternative embodiments will occur to those skilled in the art. Such variations and alternative embodiments are contemplated, and can be made without departing from the scope of the invention as defined in the appended claims.

ANNEX A

Quantization as Histogram Segmentation: Globally Optimal Scalar Quantizer Design in Network Systems Dan Muresan and Michelle Effros

*Abstract*—We propose a polynomial-time algorithm for optimal scalar quantizer design on discrete-alphabet sources. Special cases of the proposed approach yield optimal design algorithms for fixed-rate and entropy-constrained scalar quantizers, multi-resolution scalar quantizers, multiple description scalar quantizers, and Wyner-Ziv scalar quantizers. The algorithm guarantees globally optimal solutions for fixed-rate and entropy-constrained scalar quantizers and constrained optima for the other coding scenarios. We derive the algorithm by demonstrating the connection between scalar quantization, histogram segmentation, and the shortest path problem in a certain directed acyclic graph.

*Keywords*— scalar quantizer design, global, multiple descriptions, multi-resolution, successive refinement, Wyner-Ziv

I. INTRODUCTION

ANY lossy source code can be described as a quantizer followed by a lossless code. The quantizer maps the space of possible data values to a collection of allowed indices, and the lossless code maps the space of allowed indices to some uniquely decodable family of binary descriptions. This paper treats the problem of quantizer design.

A quantizer consists of a set of reproduction values (*codewords*, which together form a *codebook*) and a mapping from the source alphabet to the codebook (usually the nearest-neighbor mapping with respect to some distance). The set of alphabet symbols that are mapped to a certain codeword is called the *codecell* associated with that codeword. The set of all codecells forms a partition of the source alphabet. When the source alphabet is a discrete subset of some continuous alphabet, we call the discrete codecells *codegroups* (to distinguish them from the continuous codecells associated with the continuous super-alphabet). We focus on scalar quantizers, where the codewords are scalar source reproduction values, the codecells partition the scalar alphabet, and each codegroup is the finite collection of symbols falling in a single codecell. Fig. 1 shows a scalar alphabet with two codegroups and two codewords.

From a communications system point of view, the codecells define a quantizer encoder, and the codewords define a quantizer decoder. Together, the quantizer encoder and decoder define the quantizer In designing a quantizer, one can start with the codewords or with the codecells or codegroups. Most design algorithms take what we call a "codewords-first" approach — focusing on codebook design and defining the codecells and codegroups as functions of the codebook. In this paper

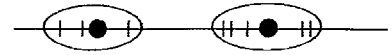

Fig. 1 Scalar source symbols, codegroups, and codewords. Vertical lines denote symbols, ellipses specify codegroups, and circles mark codewords.

we explore the alternative approach.

Our central result is a low-complexity, optimal scalar quantizer design algorithm for finite-alphabet sources. This approach applies to a variety of fixed- and variable-rate (entropy-constrained) source codes involving a single source and one or more decoders. Examples include scalar quantizers, multi-resolution scalar quantizers, multiple description scalar quantizers, and Wyner-Ziv scalar quantizers. In each case the algorithm yields a global optimum to a constrained minimization problem. In scalar quantization, this constrained minimum is identical to the unconstrained minimum, yielding the globally optimal code. In multi-resolution, multiple description and Wyner-Ziv scalar quantization, the constrained minimum may differ from the unconstrained minimum.

Previous work in globally optimal scalar quantizer design treats fixed-rate, single-encoder, single-decoder codes for finite-alphabet sources. In fixed-rate coding, the number of codewords is fixed, all codewords are described at the same rate, and the design goal is to minimize the code's expected distortion with respect to a given probability mass function (pmf) or training set. In his 1964 doctoral thesis [1], Bruce describes a polynomial-time dynamic programming algorithm for globally optimal scalar quantizer design. In [2], Sharma shows how to reduce the complexity of Bruce's algorithm by using Fibonacci heaps and briefly considers the problem of rate-distortion-optimal quantization by exploring fixed-rate scalar quantizers with successively increasing numbers of codewords. Wu and Zhang [3], [4] further refine the dynamic programming algorithm by incorporating a number of other optimization techniques Our results generalize the earlier techniques to allow variable-rate scalar quantizer design and to treat quantizers with more than one decoder and quantizers with side information at the decoder. In particular, we:

1. develop a polynomial-time algorithm for designing globally optimal entropy-constrained scalar quantizers, giving the optimal tradeoff between rate and distortion for scalar codes, 2. generalize the dynamic-programming strategy to a family of single-source-multiple-receiver and side-information source coding applications, yielding an optimal design algorithm for fixed- and variable-rate point-to-point, multi-resolution, and multiple description scalar quantizer design with and without decoder side information;

3. clarify the connection between quantization, segmentation, and the shortest path problem in a certain directed acyclic graph; and 4. derive conditions under which the constrained optimization performed in our code design fails and succeeds in guaranteeing the same solution as the corresponding unconstrained optimization.

While the discussion that follows assumes finite-alphabet sources, our algorithm yields optimal scalar quantizers for any finite source model, including the case where the empirical model for a continuous-alphabet source is derived from a finite training set. Further, our algorithm yields approximating solutions to the optimal scalar quantizer design problem for continuous alphabet sources. This is achieved by applying the finite-alphabet algorithm to a discretization of the continuous alphabet. The solution accuracy depends on how finely or coarsely the original alphabet is discretized. (The discretization need not be uniform.)

II. Problem Set-Up

Each code design aims to optimize the tradeoff between expected rates and distortions. Here the distortion measure $d(x, \hat{x})$ is assumed to be non-negative and the expectation is taken relative either to a known pmf on a finite alphabet or to a finite training set on an arbitrary alphabet. Given this effective restriction to finite alphabets and the assumption that the alphabet is ordered, in the remainder of this work we refer to scalar source alphabet $x_1 \cdots x_N$ containing $N < \infty$ symbols by the symbol indices $\{1, 2, \ldots, N\}$. The full alphabet is written $1 \cdots N$, and the histogram describing the known pmf (or the empirical estimate based on the training data) is denoted by $p[1] \cdots p[N]$. More generally, for two integers $i \leq j$ we define $i \cdots j = \{i, i+1, \ldots, j\}$; we override this definition in one special case: if $f[n]$ or $f_n$ is a function of one integer, $f[i] \cdots f[j] = \{f[i], f[i+1], \ldots, f[j]\}$ (if $f$ is integer-valued, we avoid potential confusion by explicitly preferring the second definition to the first.)

Once either a quantizer encoder or a quantizer decoder is designed, optimization of the remaining portion is straightforward. We focus on optimal encoder design for traditional, multi-resolution, and multiple description scalar quantizers. In each of these scenarios, designing an encoder on a finite alphabet is equivalent to designing one or more partitions on the source alphabet $1 \cdots N$, where each set in a partition describes all symbols given the same binary description (a codegroup). A traditional scalar quantizer encoder requires one partition. An $M$-description scalar quantizer encoder uses $M$ partitions, one for each description. An $M$-resolution scalar quantizer encoder similarly requires $M$ partitions.

Codecell Contiguity

Quantizer $Q$ has *contiguous* codecells if for each encoder partition $\mathcal{P}$ of $Q$ there exists an increasing sequence of natural numbers $T = \{t_k\}_{k=0}^{|\mathcal{P}|}$ with $t_0 = 0$, $t_{|\mathcal{P}|} = N$, and $\mathcal{P} = \{t_0 + 1 \cdots t_1, t_1 + 1 \cdots t_2, \ldots, t_{|\mathcal{P}|-1} + 1 \cdots t_{|\mathcal{P}|}\}$. Thus for quantizers with contiguous codecells there is a one-to-one relationship between partitions and threshold sequences. For any threshold sequence $T = \{t_k\}_{k=0}^{K}$ with $t_0 = 0$ and $t_K = N$, we define the *partition assembly function* as the bijective map $$A(T) = \{t_0 + 1 \cdots t_1, t_1 + 1 \cdots t_2, \ldots, t_{K-1} + 1 \cdots t_K\}.$$

Each $t_k$ (with the exception of $t_0 = 0$) is the index of the last member in a codegroup.

The quantizer design algorithm proposed in this work finds, in each coding scenario, the optimal quantizer among all quantizers with contiguous codecells. The resulting scalar quantizer, multi-resolution scalar quantizer, multiple description scalar quantizer, or Wyner-Ziv scalar quantizer is optimal if and only if there exists an optimal scalar quantizer of that type with contiguous codecells.

The codecell contiguity requirement allows for optimal design in many but not all situations. For example, for some sources and distortion measures there exist rate-distortion points achievable through entropy-constrained scalar quantization only if non-contiguous cells are allowed [5]. Likewise, optimal use of decoder side-information may require non-contiguous encoding cells, as discussed in Sec. VII. However, for some distortion measures and code types, any rate-distortion point on the lower convex hull of the set of rate-distortion points achievable through scalar coding is achievable with contiguous codecells. In Sec. VII, we discuss conditions under which codecell contiguity is consistent with quantizer optimality and conditions under which codecell contiguity is not consistent with quantizer optimality in scalar quantization, multi-resolution scalar quantization, and multiple description scalar quantization.

Segmentation and Quantization

We view the histogram $p[1] \cdots p[N]$ as a *probability signal*. Given the contiguity assumption, each codegroup on the source alphabet corresponds to a segment of the probability signal. Since the performance of a partition — measured by the expected rate and distortion of the corresponding quantizer encoder and its optimal decoder — is a function of the probability signal, we treat the partition-design problem on alphabet $1 \cdots N$ as a segmentation problem on signal $p[1] \cdots p[N]$. For example, if source symbols $23 \cdots 45$ form a codegroup, then the corresponding segment of the probability signal comprises samples $p[23] \cdots p[45]$. We want to design the segmentation that achieves the best possible tradeoff between expected rates and expected distortions, and we want the design algorithm to be fast.

Fast Approximations

We consider both true partition optimization relative to source alphabet $1 \cdots N$ and approximate optimization where partitions are constrained to a coarse grid. We achieve the coarse grid by dividing the symbols of $1 \cdots N$ into $\tilde{N}$ contiguous, non-overlapping cells $\{G_k\}_{k=1}^{\tilde{N}}$ that partition $1 \cdots N$, (i.e., $\bigcup_{k=1}^{\tilde{N}} G_k = 1 \cdots N$, $G_k \bigcap G_\ell = \phi$ if $k \neq \ell$). Given the coarse grid $\mathcal{G} = \{G_k\}_{k=1}^{\tilde{N}}$ (a partition itself), the partition design problem on $1 \cdots N$ simplifies to a partition design problem on a fixed, ordered set of indivisible cells. While there are $2^{N-1}$ partitions of the original alphabet, only $2^{\tilde{N}-1}$ of these are compatible with the $\tilde{N}$-cell grid. Thus guaranteeing true optimality requires $\tilde{N} = N$ (with each alphabet symbol being allotted a separate grid cell), but using $\tilde{N} < N$ allows for faster optimization.

Note that even though the cells are constrained to conform to the $\tilde{N}$-cell grid, the problem does not reduce to optimal partitioning of an $\tilde{N}$-symbol coarse alphabet. The impediment is that we cannot assign values to the $\tilde{N}$ candidates in a manner that preserves distortion for all admissible partitions. Thus it is necessary to go back to the source alphabet when evaluating distortions. Given the threshold sequence $\{g_k\}_{k=0}^{\tilde{N}}$ of the partition $\mathcal{G}$, the codegroup comprising grid cells $G_a \cdots G_b$ is $$C_{a \cdots b} = \left\{ x_n : n \in \bigcup_{k=a}^{b} G_k \right\} = x_{1+g_{a-1}} \cdots x_{g_b}.$$

*Example 1:* Break source alphabet $1 \cdots 16$ into 4 cells: $G_1 = 1 \cdots 4$, $G_2 = 5 \cdots 8$, $G_3 = 9 \cdots 12$, $G_4 = 13 \cdots 16$. The search for an optimal segmentation on symbols $1 \cdots 16$ is approximated by a search for an optimal partition on cells $1 \cdots 4$. The threshold sequence for the grid is $\{g_k\}_{k=0}^{4} = \{0, 4, 8, 12, 16\}$. One possible partition on this coarse grid is $\{1 \cdots 3, 4 \cdots 4\}$; this partition corresponds to partition $\{1 \cdots 12, 13 \cdots 16\}$ on the original alphabet, which in turn corresponds to codegroups $C_{1 \cdots 3} = x_1 \cdots x_{12}$, $C_{4 \cdots 4} = x_{13} \cdots x_{16}$.

III. SCALAR QUANTIZATION

We begin by considering the traditional source coding paradigm, where a single encoder describes information to be interpreted by a single decoder. Since the solution to the fixed-rate problem appears in [1], [2], [3], [4], this section treats only variable-rate code design.

Optimization Criterion

Let $D(\mathcal{P})$ and $R(\mathcal{P})$ be the expected distortion and output entropy, respectively, for the variable-rate scalar quantizer corresponding to partition $\mathcal{P}$. (Measuring rate as entropy in variable-rate codes separates the code design from the specific entropy code implementation.) For any partition achieving a point on the operational distortion-rate function $\tilde{D}(R) = \inf_{\mathcal{P}} \{D(\mathcal{P}) : R(\mathcal{P}) \leq R\}$, the corresponding variable-rate scalar quantizer is optimal in the sense that no other partition can achieve a lower distortion using the same or lower entropy. For any $\mathcal{P}$ with $(D(\mathcal{P}), R(\mathcal{P}))$ lying on the lower convex hull of $\tilde{D}(R)$, there exists a Lagrangian multiplier $\lambda > 0$ for $\mathcal{P}$ minimizes $$J(\mathcal{P}, \lambda) = D(\mathcal{P}) + \lambda R(\mathcal{P}). \tag{1}$$

We therefore use the Lagrangian $J(\mathcal{P}, \lambda)$ as the optimization criterion for our partition design. The resulting code is called an entropy-constrained scalar quantizer (ECSQ) [6].

The key observation is that rate and distortion (and thus the Lagrangian cost) are additive over codegroups. For a partition $\mathcal{P}$, $R(\mathcal{P}) = \sum_{C \in \mathcal{P}} r(C)$ where $r(C) = -p(C) \log p(C)$ is called the *partial rate* for codegroup $C$ and $p(C) = \sum_{n \in C} p[n]$ is the probability of codegroup $C$.[1] Similarly, $D(\mathcal{P}) = \sum_{C \in \mathcal{P}} d(C)$, where $d(C) = \sum_{n \in C} p[n] d(x_n, \mu(C))$ is the *partial distortion* for codegroup $C$ and codeword $\mu(C)$. When $d(x, \hat{x}) = (x - \hat{x})^2$, the optimal codeword $\mu(C)$ is the centroid $\mu(C) = \sum_{n \in C} p[n] x_n / p(C)$ of codegroup $C$. Note that $p(C)$ and, in turn, $r(C)$, $\mu(C)$, and $d(C)$ are extensions of the scalar pmf $p[n]$. We employ these terms liberally in the remainder of this work.

Segmentation and Shortest Path Problems

The problem of signal segmentation and the single-source shortest path problem in a weighted directed acyclic graph (WDAG) are related, and a number of authors have previously exploited this observation to obtain rate-distortion optimality in source codes that rely on segmentation. In [7], Chou and Lookabough use dynamic programming to segment a source sequence for a variable-rate code with codewords of varying dimensions ("variable-to-variable" length coding). Effros, Chou, and Gray take a similar approach to signal segmentation for variable-dimension weighted universal coding in [8]. In [9], Xiong, Herley, Ramchandran, and Orchard use a dynamic programming algorithm for signal segmentation in a source code with time-varying wavelet-packets; this algorithm is generalized and refined in [10]. Schuster and Katsaggelos use the DAG-shortest-path algorithm to separate objects from background for video coding in [11]. In each of these examples, segmentation is part of the encoding procedure, and the optimal segmentation is the segmentation that yields the best tradeoff between rate and distortion in the resulting code.

In this paper we again use the relationship between the segmentation and shortest path problems to find a rate-distortion-optimal segmentation solution. In this case, however, we segment the probability signal during code design rather than segmenting the source signal during encoding. Our segmentation describes the quantizer encoder, and optimality is obtained when this encoder yields the scalar quantizer with the best Lagrangian performance.

Our optimal segmentation algorithm is equivalent to the shortest-path algorithm on a WDAG called the *partial RD graph*. The partial RD graph for ECSQ has $\tilde{N} + 1$ vertices corresponding to the $\tilde{N} + 1$ intervals of a line delimited by $\tilde{N}$ points; the points are a topological abstraction of the $N$ alphabet cells and must satisfy the total ordering induced by the original alphabet (for cells $c_1$ and $c_2$, $c_1 < c_2$ if and only if $x < y$ for all $x \in c_1, y \in c_2$). For every pair $(u, v)$ with $u < v$ there is an arc (directed edge) from $u$ to $v$. The arc corresponds to a codegroup comprising cells $u +$ ---
[1] All logarithms in this work are base-2

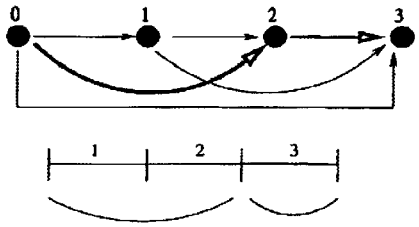

Fig. 2. Partial RD graph for an alphabet with $\hat{N} = 3$ cells. The path describing the partition {1···2, 3···3} appears in bold.

$1 \cdots v$ and the weight is the Lagrangian cost $d(C_{u+1\cdots v}) + \lambda r(C_{u+1\cdots v})$ for that codegroup. The graph has $\hat{N}(\hat{N}+1)/2$ arcs (see Fig. 2).

The partial RD graph illustrates the recursive nature of partitions of cells. As in [10], let $S_u$ denote the set of partitions on cells $1 \cdots u$ (by definition $S_0 = \emptyset$). Then for any $1 \leq v \leq \hat{N}$, $S_v$ can be obtained by extending "shorter" partitions with the appropriate codegroup $$S_v = \bigcup_{u=0}^{v-1} \bigcup_{\mathcal{P} \in S_u} \mathcal{P} \cup \{C_{u+1\cdots v}\}.$$

Note that all partitions $\mathcal{P} \in S_u$ must be extended with the same codegroup $C_{u+1\cdots v}$ to obtain partitions in $S_v$. In the partial RD graph, then, each vertex $v$ corresponds to the partition set $S_v$, and each arc corresponds to a codegroup extending collections of "shorter" partitions to collections of "longer" partitions. A path from 0 to some vertex $v$ shows how to "grow" a unique partition in $S_v$ by successively adding codegroups. Each path from 0 to $\hat{N}$ describes a unique partition.

Proof of Correctness

We now prove that optimal quantization is equivalent to finding the shortest path between vertices 0 and $\hat{N}$. We first demonstrate a one-to-one correspondence between partitions and paths in the graph. A path of length $l$ from 0 to $\hat{N}$ is a chain of edges $(v_0, v_1), (v_1, v_2), \ldots, (v_{l-1}, v_l)$ with $v_0 = 0$ and $v_l = \hat{N}$. Because of the structure of our WDAG, $(v_i, v_{i+1})$ is an arc if and only if $v_i < v_{i+1}$. Therefore, we can associate bijectively to each arc $(v_1, v_2)$ the codegroup $v_1 + 1 \cdots v_2$. For a partition, consecutive codegroups must be adjacent; for a path, consecutive arcs must share one vertex. Therefore an enumeration of the arcs corresponding to the codegroups in a partition forms a path, and vice-versa. This establishes the required two-way correspondence. Next, we must show that the total weight on a path from 0 to $\hat{N}$ is equal to the Lagrangian for the partition corresponding to the path; this property follows directly from our construction Algorithms As outlined in [12], the single-source shortest path problem in a WDAG with $V$ vertices and $E$ edges can be solved in $O(V + E)$ time. The algorithm involves successive "relaxation" (improvement) of all shortest-paths using vertices taken in topological order; thus at each step a single vertex is used as a "stepping stone" to revise many shortest-paths. The dynamic programming algorithm in [10] (not presented explicitly as a graph algorithm in that paper) has the same complexity but is simpler and more natural in that no relaxation is involved — rather, in the $n^{th}$ step the shortest path to the $n^{th}$ vertex in topological order is computed (definitively) based on previous shortest-paths; thus at each step a single shortest-path is computed by examining many vertices. In the context of segmentation problems, this algorithm follows naturally from the recursive structure of the partition sets $S_v$. Whatever the shortest-path algorithm employed, the resulting path immediately translates into a solution to the optimal quantization problem.

The first step in both algorithms is to sort the vertex set topologically, that is, to order the $V$ vertices of the graph in a sequence $\{v_k\}_{k=1}^{V}$ such that for $k > l$, there are no arcs from $v_k$ to $v_l$ (this is always possible in an acyclic graph since the relation induced on the vertex set by the edge set is a partial order). In the case of the partial RD graph used for optimal ECSQ design, the vertex labels give the topological order of the vertices so we do not need to worry about this step. In general, the algorithm described below produces a topological order in $O(V + E)$ steps (another algorithm, which sorts the vertices according to finish times under depth-first traversal, as detailed in [12], has similar complexity and may be easier to implement, but requires more background to explain.)

For each vertex $v$ keep a counter $a[v]$, initialized with the in-degree of $v$ (the number of incoming arcs); also maintain a stack of "free vertices" $F$ initialized with the set of vertices with in-degree zero. Then, repeatedly pop vertices $v$ from $F$, append them to the topologically sorted sequence $S$, and decrement $a[u]$ for all successors $u$ of $v$. Whenever some $a[u]$ becomes zero, place $u$ on $F$. The algorithm stops when $S$ contains all the $V$ vertices; if $F$ becomes empty at any point before $S$ has filled up, the graph has a cycle.

Given the sorted vertex sequence $\{v_k\}_{k=1}^{V}$, the dynamic programming algorithm proceeds as follows. At each step $\ell \in 1 \cdots V$, compute the shortest path to vertex $v_\ell$ as $$s[\ell] = \min_k (s[k] + w_{k,\ell}),$$

where $w_{k,\ell}$ is the weight on arc $(v_k, v_\ell)$ and the minimization is performed over the ancestor set of vertex $v_\ell$ (i.e., the set of vertices $v_k$ that have outgoing arcs $(v_k, v_\ell)$ connecting them to the target $v_\ell$). Since the sequence $\{v_k\}_{k=1}^{V}$ is sorted topologically, the ancestors of any vertex occur before it in the sequence, and any shortest paths $s[k]$ on the right hand side are well defined (set $s[k] = 0$ if $v_k$ has no ancestors).

The partial RD graph has $O(\hat{N}^2)$ edges, therefore, given the weights, optimal quantizer design can be performed in $O(\hat{N}^2)$ time. Each weight requires a partial rate and distortion to be computed. The partial rates take $O(N)$ time each. Since finding each of the $O(\tilde{N}^2)$ partial distortions requires $O(N^2)$ operations in general (with a brute-force centroid search, and assuming that the centroid can be approximated to the precision grid given by the source alphabet), the preprocessing required to obtain the graph structure takes $O(\tilde{N}^2 N^2)$ time. For some distortion measures (including the MSE, $d(x,\hat{x}) = (x-\hat{x})^2$) the centroid of a set can be computed in linear time; in this case each weight requires $O(N)$ operations, the entire preprocessing takes $O(\tilde{N}^2 N)$ and there are no approximations.

By carefully arranging repetitive computations, we can do better: when $d(x,\hat{x}) = (x-\hat{x})^2$, the cost can be reduced to $O(N)$ preprocessing cost by computing the cumulative moments of order 0, 1, and 2 for the source pmf so that each partial distortion can be computed using differences of these cumulative moments [3] in a constant time operation. The cummulative moments of order 0 also help determine each partial rate in constant time $(r(C) = -p(C)\log p(C)$, where codegroup probability $p(C)$ can be obtained simply as a difference between cummulative moments of order 0 at the beginning and right after the end of the codegroup); because partial rates are independent of the distortion measure, we will always precompute cummulative moments of order 0 (but higher-order moments may not be required for measures other than MSE). With this trick the cost required for determining partial distortions dominates other preprocessing costs.

More generally, when $d(x,\hat{x})$ is a convex function of $|x-\hat{x}|$, the preprocessing cost can be reduced to $O(N^2)$ by using a fast matrix search algorithm [4]. For general distortion measures, [4] gives an $O(N^3)$ dynamic programming algorithm. Performing the weight calculations during the shortest path algorithm (rather than in an independent preprocessing step) yields a total complexity for globally optimal ECSQ design of $O(\tilde{N}^2 + N)$, $O(N^2)$, $O(N^3)$ or $O(\tilde{N}^2 N)$, depending on the distortion measure.

Note that the matrix search algorithm presented in [4], as well as the more general $O(N^3)$ algorithm, may only yield approximate distortions since they discretize the possible values for codegroup centroids to a grid of $N$ symbols. However, there is one important case when this discretization does not preclude exact results: for the absolute distortion measure $d(x,\hat{x}) = |x - \hat{x}|$, the centroid of any set can only be a member of that set (a fact easily proved by noting that the function $f(x) = \sum_{i=1}^{N} |x - x_i|$ is piecewise linear with critical points only at $x_i$); thus codegroup centroids must be among the $N$ symbols of the source alphabet and the discretization grid introduces no approximation.

IV. MULTIPLE-DECODER SYSTEMS

The algorithm described in Sec. III treats scalar quantizer design for the traditional source coding paradigm, where a single encoder describes information to be decoded by a single decoder. We next generalize that algorithm to source codes designed for more general network scenarios. In particular, we design optimal scalar quantizers for systems where a single source is described to multi-

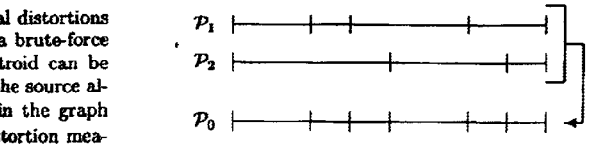

Fig. 3. Side partitions $\mathcal{P}_1$ and $\mathcal{P}_2$ and central partition $\mathcal{P}_0$ ple decoders. Examples of single-source, multiple-decoder systems include multi-resolution and multiple description scalar quantizers.

Multi-resolution scalar quantization (MRSQ) [13], [14], [15], [16] is scalar quantization yielding embedded source descriptions. The embedded source description may be decoded in part or in whole, with an expected reproduction quality that improves as a function of the rate of the decoded sequence. Since the binary description may be decoded at a variety of rates, the MRSQ decoder effectively contains a collection of decoders, one for each rate at which the binary sequence may be decoded. MRSQ is useful in applications where the compressed data sequence is intended for multiple users with differing rate and reproduction quality needs.

Multiple description scalar quantization (MDSQ) [17], [18] is another single-source, multiple-decoder scalar quantization system. In this case, the source description is broken into a collection of packets, and reconstruction under any combination of received and lost packets is required. MDSQ is useful in diversity systems, where the encoder sends separate descriptions of the source over $M$ different channels and reconstruction is required using the successfully received descriptions. MDSQ is also useful for packet-based communication systems and distributed data storage systems, where reconstruction of the data using a subset of the original set of source descriptions may be required.

We next describe the optimal code design algorithm for single-source, multiple-decoder systems. We focus our description on variable-rate MDSQ design with $M = 2$ (thus 2DSQ instead of MDSQ) for simplicity. The solutions for fixed-rate coding and $M > 2$ are natural extensions of the variable-rate $M = 2$ solution, as described at the end of this section. The optimal MDSQ design algorithm leads to an optimal MRSQ design algorithm since MRSQ is a special case of MDSQ where decoders are designed for a *subset* of the possible packet-loss scenarios rather than all packet-loss scenarios. A discussion of optimal code design for MRSQ and other examples of MDSQs with restricted packet-loss scenarios appears in Sec. V.

Set-Up

The encoder of a 2DSQ gives two separate data descriptions and is therefore defined by two distinct partitions, $\mathcal{P}_1$ and $\mathcal{P}_2$, of the alphabet. The decoder may receive either of the two descriptions alone, in which case the problem reduces to ordinary single-description (SD) quantization with partition $\mathcal{P}_1$ or $\mathcal{P}_2$. More interestingly, both descriptions may be received; in this case, the decoder knows that the source symbol $x$ satisfies $x \in C_1 \cap C_2$ for some codegroups $C_1 \in \mathcal{P}_1$ and $C_2 \in \mathcal{P}_2$, yielding an effective underlying partition $\mathcal{P}_0 = \{C_1 \cap C_2 : C_1 \in \mathcal{P}_1, C_2 \in \mathcal{P}_2\}$ of the data. Partition $\mathcal{P}_0$ is called the *central partition*, while $\mathcal{P}_1$ and $\mathcal{P}_2$ are called *side partitions* (see Fig. 3). Note that the intersection needed to compute the central partition involves $O(|\mathcal{P}_1| + |\mathcal{P}_2|)$ operations since most pairs of codegroups don't intersect. A plausible algorithm which does not explicitly perform codegroup intersections is to merge-sort the threshold sequences of the side partitions as $\mathcal{P}_0 = A(\text{MERGE}(A^{-1}(\mathcal{P}_1), A^{-1}(\mathcal{P}_2)))$. (Recall that $A$ is the mapping from each threshold sequence to its corresponding partition.)

Using the notation introduced in (1), let $R_i = R(\mathcal{P}_i)$ ($i \in 1 \cdots 2$) and $D_i = D(\mathcal{P}_i)$ ($i \in 0 \cdots 2$). Then $(R_i, D_i)$ ($i \in 1 \cdots 2$) is the expected rate-distortion performance when only the $i$th description is received, and $D_0$ is the expected distortion when both descriptions are received. (Rate $R(\mathcal{P}_0)$ is not used since partition $\mathcal{P}_0$ is described only through the description of $\mathcal{P}_1$ and $\mathcal{P}_2$.) Again $D(\mathcal{P}_i) = \sum_{C \in \mathcal{P}_i} d(C)$ and $R(\mathcal{P}_i) = \sum_{C \in \mathcal{P}_i} r(C)$, with $d(C) = \sum_{n \in C} p[n] d(x_n, \mu(C))$ and $r(C) = -p(C) \log p(C)$. Let $$\mathcal{D}^{vr} = \{(R(\mathcal{P}_i)|_{i=1}^2, D(\mathcal{P}_i)|_{i=0}^2) : \mathcal{P}_1 \text{ and } \mathcal{P}_2 \text{ induce } \mathcal{P}_0\}$$

be the set of rate-distortion vectors achievable through variable-rate coding. Any pair of partitions $(\mathcal{P}_1, \mathcal{P}_2)$ achieving a variable-rate coding point $(R_1, R_2, D_0, D_1, D_2)$ on the lower bounding surface of $\mathcal{D}^{vr}$ is optimal in the sense that there does not exist another pair of partitions $(\mathcal{P}_1', \mathcal{P}_2')$ with $R_i(\mathcal{P}_i') \leq R_i$ for all $i \in 1 \cdots 2$ and $D_i(\mathcal{P}_i') \leq D_i$ for all $i \in 0 \cdots 2$. For any $(\mathcal{P}_1, \mathcal{P}_2)$ with $(R(\mathcal{P}_i)|_{i=1}^2, D(\mathcal{P}_i)|_{i=0}^2)$ on the lower convex hull of $\mathcal{D}^{vr}$, there exist non-negative Lagrangian vectors $\lambda^2$ and $\nu^2$ for which $(\mathcal{P}_1, \mathcal{P}_2)$ minimizes $$J^{vr}((\mathcal{P}_1, \mathcal{P}_2), \nu^2, \lambda^2) = D_0 + \sum_{i=1}^{2}[\nu_i D(\mathcal{P}_i) + \lambda_i R(\mathcal{P}_i)]$$

We therefore use $J^{vr}((\mathcal{P}_1, \mathcal{P}_2), \nu^2, \lambda^2)$ as the optimization criterion for partition design in variable-rate 2DSQs.

Solution

In the multiple description problem we *jointly* optimize the two side partitions for the encoder. If the $D_0$ term were absent from the target function, the design could be done separately for each partition as in the SD case; with $D_0$, we must keep track of the central partition (which is a dependent function of the 2 side partitions) throughout the algorithm.

To arrive at a generalization of the partial RD graph, consider the partition-set interpretation of vertices: in SQ, each vertex $v$ represents a set of partitions that spans the cell range $0 \cdots v$; in MDSQ, vertex labels are pairs $(v_1, v_2)$ and vertex $(v_1, v_2)$ represents a set of *partition pairs* $(\mathcal{P}_1, \mathcal{P}_2)$ such that $\mathcal{P}_1$ spans $0 \cdots v_1$ and $\mathcal{P}_2$ spans $0 \cdots v_2$ (we ignore the central partition for the time being). The partitions in a pair are aligned on the left side

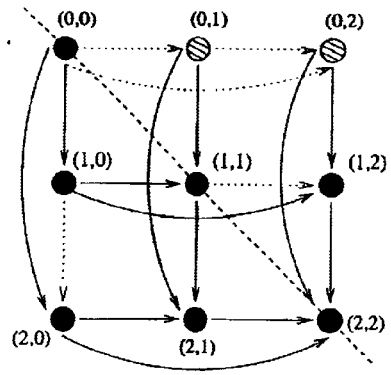

Fig. 4. Partial RD graph, 2 descriptions, 2 × 2 cells

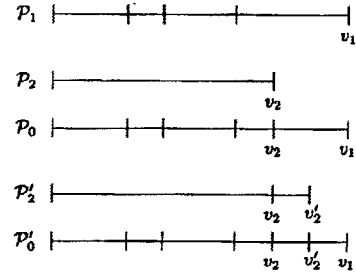

Fig. 5. The central partition is determined only to the end of the shorter side partition. In this example, the central partition changes in $v_2 \cdots v_1$ when cell $v_2 \cdots v_2'$ is added to $\mathcal{P}_2$. The central partition on values less than $\min\{v_1, v_2\}$ cannot change with cell additions.

Construction of the edge set presents a certain difficulty; naively, there should be an arc from vertex $(v_1, v_2)$ to all vertices $(v_1', v_2)$ and $(v_1, v_2')$ such that $v_1' > v_1$ and $v_2' > v_2$, since we can extend a partition pair by adding a codegroup to either of the 2 side partitions, as shown in the example in Fig. 4. (In the discussion that follows, we remove the shaded vertices and dotted arcs, but for now they should be treated like their solid counterparts.) We emphasize the fact that only one side partition may be extended at a time, thus only one side codegroup is added by each arc. The difficulty arises when we attempt to assign weights to the edges. As we next demonstrate, some partitions must not be represented in their associated vertex and to guarantee that exclusion, some edges must be removed from the graph.

First, we must account for the central partition in order to be able to compute Lagrangian costs. For vertices $(v, v)$ (where the 2 side partitions have equal length), $\mathcal{P}_0$ can be computed as explained above and illustrated in Fig. 3. When the side partitions have different lengths, however, one must realize that the central partition can be deter-

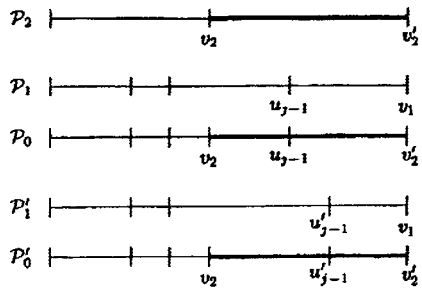

Fig. 6. The shorter side partition is too short. In this example, $v_2 < u_{j-1}$ implies that the central partition on $v_2 \cdots v_1$ (and thus the weight on the arc from $(v_1, v_2)$ to $(v_1, v'_2)$) varies with $u_{j-1}$.

mined only up to the end of the shorter side partition. Consider the $(v_1, v_2)$ partition pair with $v_1 > v_2$ shown in Fig. 5. Naively, we would find all intersections of side codegroups, so that the last central codegroup would be $v_2 \cdots v_1$; however, adding a new side codegroup $v_2 \cdots v'_2$ to $\mathcal{P}_2$, as illustrated in the lower portion of Fig. 5, breaks the central codegroup $v_2 \cdots v_1$ into two new central codegroups $v_2 \cdots v'_2$ and $v'_2 \cdots v_1$ that depend on $v'_2$. While the central codegroups lying within the range $1 \cdots \min(v_1, v_2)$ are permanent – meaning that they are not influenced by the subsequent addition of side codegroups – the central codegroups in $\min(v_1, v_2) \cdots \max(v_1, v_2)$ may vary as a function of future additions to the shorter side partition.

The consequence of ambiguity in the central partition definition is a corresponding difficulty in assigning weights to the graph's arcs. Each arc corresponds to a single codegroup being added to one of the side partitions and one or possibly multiple codegroups being added to the central partition. To be able to assign a unique weight to that arc, the total Lagrangian cost of the newly added codegroups must be the same regardless of the "internal structure" of the partition being extended. That is, the cost must be a function only of the labels of the two vertices that it joins. The codegroup added to one of the side partitions is clearly determined by the two vertex labels only, but the central codegroups are not, in general. For example, consider the situation shown in Fig. 6. Here we extend the shorter partition $\mathcal{P}_2$ by adding group $v_2 \cdots v'_2$. The figure shows two examples of possible values for partition $\mathcal{P}_1$. Both examples correspond to a single path from node $(v_1, v_2)$ to node $(v_1, v'_2)$. Yet the resulting central codegroups, and thus the Lagrangian costs, differ in the two cases, making the label for the arc ambiguous. This problem seems to arise from the fact that $\mathcal{P}_2$ is "too short," one and a half groups shorter than $\mathcal{P}_1$. We need a way to keep side partitions more "even" to avoid this type of problem.

The *codegroup lag*, defined using the two threshold sequences $\{t_k\}_{k=0}^{J} = A^{-1}(\mathcal{P}_1)$ and $\{u_k\}_{k=0}^{K} = A^{-1}(\mathcal{P}_2)$, provides a measure of how "even" two partitions are; partitions must be aligned on the left side ($u_0 = v_0$) for the following definition to apply. We say that $\mathcal{P}_1$ lags $\mathcal{P}_2$ by $L$ codegroups if there are $L$ codegroups in $\mathcal{P}_2$ not lying entirely inside the range covered by $\mathcal{P}_1$ (i.e., $u_{K-L} \leq t_J = v_1 < u_{K-L+1}$). We want to keep the codegroup lag between the two side partitions at most 1. (A lag of zero means that the partitions are of equal total length, $v_1 = v_2$, a case which we handle later in this section.) Call a partition pair with codegroup lag less than or equal to 1 *valid*.

Suppose that $\mathcal{P}_2$ is the shorter partition ($v_2 < v_1$). Then by definition, a lag of 1 implies that the range $v_2 \cdots v_1$ is included in the last codegroup of $\mathcal{P}_1$ (i.e., $t_{J-1} < u_K = v_2 < t_J = v_1$). Adding codegroup $v_2 \cdots v'_2$ to $\mathcal{P}_2$ results in a single central codegroup $v_2 \cdots \min(v_1, v'_2)$ being generated, regardless of the structure of the side partitions; therefore we achieve our objective. The weight on each arc is defined as the Lagrangian cost associated with one new side codegroup and one new central codegroup.

We now have a condition (validity) that guarantees that adding side codegroups results in predictable central codegroups being generated; we next constrain the partial RD graph to obey that condition. We want to keep partition pairs with codegroup lag more than 1 unrepresented in the vertices of the graph. Since the partition pairs represented in each vertex are defined by the paths between (0, 0) and that vertex, it is enough to break certain malignant paths by removing arcs from the graph.

Our goal is accomplished by eliminating arcs that extend the longer side partition in a partition pair: extending the longer side partition always increases codegroup lag by 1, thus creating undesirable partitions with a lag of 2 or more; by contrast, extending the shorter side partition does not increase lag when $v_1 \neq v_2$ (the exact change in lag depends on the exact structure of the partitions), and changes lag from 0 to 1 when $v_1 = v_2$, therefore (by an inductive argument) lag can be kept at 1 or 0. When $v_1 = v_2$, no central codegroups are added regardless of which side partition is extended and by how much. To avoid duplicate paths, we choose to extend $\mathcal{P}_1$ if $v_1 = v_2$.

The result is a *partition extension rule* that allows only two types of arcs: $((v_1, v_2), (v_1, v'_2))$ with $v_1 > v_2$, $v'_2 > v_2$ and $(((v_1, v_2), (v'_1, v_2))$ with $v_1 \leq v_2$, $v'_1 > v_1$. In the example of a partial RD graph for 2DSQ given in Fig. 4, the disallowed arcs are dotted. A consequence of eliminating these arcs is that some vertices become inaccessible from (0, 0) and therefore cannot be visited; we eliminate these vertices and the arcs originating from them. (To be precise, the inaccessible vertices are exactly those of the form $(0, v_2)$ with $v_2 > 0$; they are shaded in Fig. 4.)

We are left with a graph of $(\hat{N} + 1)^2$ vertices, $\hat{N}$ of which are inaccessible. To count arcs, we divide vertices $(v_1, v_2)$ in two categories: those with $v_1 = v_2$ and those with $v_1 \neq v_2$. If $v_1 = v_2 = v$ ($v \in 0 \cdots \hat{N}$), vertex $(v_1, v_2)$ has $\hat{N} - v$ outgoing arcs; thus the graph contains a total of $\hat{N}(\hat{N}+1)/2$ arcs from the first category. In the second category, either $v_1 < v_2$ or $v_2 < v_1$. If $v_1 < v_2$, vertex $(v_1, v_2)$ has $\hat{N} - v_1$ outgoing arcs, for each $v_1 \in 0 \cdots \hat{N}$ there are $\hat{N} - v_1$ such vertices with $v_2 \in v_1 + 1 \cdots \hat{N}$; thus the graph contains $\sum_{v=0}^{\hat{N}}(\hat{N} - v)^2 = \hat{N}(\hat{N} + 1)(2\hat{N} + 1)/6$ second-category arcs from vertices with $v_1 < v_2$ and an equal number from vertices with $v_2 < v_1$. The total number of arcs is $\hat{N}(\hat{N} + 1)(4\hat{N} + 5)/6$ (out of which $\hat{N}^2$ originate in inaccessible vertices).

The weight $W$ on an arc $((v_1, v_2), (v'_1, v'_2))$ is as follows:

- When $v_1 = v_2 = v'_2 = v$, one codegroup $C_1 = C_{v...v'_1}$ is added to $\mathcal{P}_1$ and none are added to $\mathcal{P}_0$; thus $W = \nu_1 d(C_1) + \lambda_1 r(C_1)$.
- When $v_2 = v'_2 > v_1$, one codegroup $C_1 = C_{v_1...v'_1}$ is added to $\mathcal{P}_1$ and one central codegroup $C_0 = C_{v_1...\min(v'_1,v_2)}$ is generated; thus $W = d(C_0) + \nu_1 d(C_1) + \lambda_1 r(C_1)$.
- When $v_1 = v'_1 > v_2$, one codegroup $C_2 = C_{v_2...v'_2}$ is added to $\mathcal{P}_2$ and one central codegroup $C_0 = C_{v_2 \min(v_1,v'_2)}$ is generated; thus $W = d(C_0) + \nu_2 d(C_2) + \lambda_2 r(C_2)$.

When $d(x,\hat{x}) = (x-\hat{x})^2$ and we pre-compute the cumulative moments as in [3], each weight can be computed in constant time since our construction guarantees that at most two codegroups are generated by adding an arc to a given path.

This completes the description of the 2DSQ partial RD graph; running one of the shortest path algorithms described in Sec. III with source $(0,0)$ and sink $(\hat{N},\hat{N})$ yields the optimal 2DSQ with contiguous codecells.

Proof of Correctness

As in Sec. III, we must exhibit a bijection between paths from $(0,0)$ to $(\hat{N},\hat{N})$ and partition pairs. One direction is obvious: paths still describe how to "grow" partition pairs by way of successive extensions, and we only need to keep track of the two side partitions for this part of the proof. It is sufficient to map each arc to the corresponding codegroup being added to either $\mathcal{P}_1$ or $\mathcal{P}_2$, (based on the labels of the origin and destination vertices of the arc) to obtain the partition pair associated to a path.

Showing that for each $(\hat{N},\hat{N})$ partition pair there is a unique path in the graph is a little more involved. First some terminology: given two partitions $\mathcal{P}$ and $\mathcal{P}'$ we say that $\mathcal{P}$ is a *truncated version* of $\mathcal{P}'$ if $\mathcal{P}' \subseteq \mathcal{P}$ and the two partitions are aligned on the left side (i.e., the threshold sequences $\{t_i\}_{i=0}^l$ and $\{t_i\}_{i=0}^{l'}$ must match, with $l' \leq l$ and $t_i = t'_i$ for $i \in 0 \cdots l'$). Similarly, for two partition pairs $(\mathcal{P}_1, \mathcal{P}_2)$ and $(\mathcal{P}'_1, \mathcal{P}'_2)$, we define $(\mathcal{P}'_1, \mathcal{P}'_2)$ to be a truncated version of $(\mathcal{P}_1, \mathcal{P}_2)$ if $\mathcal{P}'_1$ and $\mathcal{P}'_2$ are truncated versions of $\mathcal{P}_1$ and $\mathcal{P}_2$, respectively. (Since the partitions in each pair are presumed to be aligned on the left side, it follows that all four partitions are aligned on the left side.) We also say that some codegroup $C_i$ added to $\mathcal{P}'_i$ ($i \in 1 \cdots 2$) extends $(\mathcal{P}'_1, \mathcal{P}'_2)$ *according to* $(\mathcal{P}_1, \mathcal{P}_2)$ if the extension is still a truncated version of $(\mathcal{P}_1, \mathcal{P}_2)$. Note that if $(\mathcal{P}'_1, \mathcal{P}'_2)$ is not a truncated version of $(\mathcal{P}_1, \mathcal{P}_2)$, none of its extensions are either, regardless of how many codegroups are added, since a mismatch in the threshold sequence cannot be repaired by adding more elements.

Now consider an arbitrary valid partition pair $(\mathcal{P}_1, \mathcal{P}_2)$ and let L be the sum of the number of codegroups in $\mathcal{P}_1$ and the number of codegroups in $\mathcal{P}_2$. We next show by induction that for any $l \in 0 \cdots L$ the graph contains a unique path of length $l$ that begins at $(0,0)$ and describes a truncated version of $(\mathcal{P}_1, \mathcal{P}_2)$. For $l = 0$, this is immediate. For length $l > 0$, any path of length $l$ can be decomposed into a path of length $l - 1$ and an extra arc. If the length $l$ path is to correspond to a truncated version of $(\mathcal{P}_1, \mathcal{P}_2)$, we have seen that the length $l - 1$ path must also. There exists only one path of length $l - 1$ that satisfies this condition, and the extension rule guarantees that there exists a unique arc that extends it according to $(\mathcal{P}_1, \mathcal{P}_2)$. (The latter statement uses the fact that both $(\mathcal{P}_1, \mathcal{P}_2)$ and the partition pair corresponding to the length-$(l-1)$ path are valid.) Therefore the set of paths of length $l$ satisfying the condition has cardinality exactly one. Note that our language implicitly uses the one-way correspondence from paths to partitions, which has already been demonstrated (but not its inverse).

Extension from 2DSQ to MDSQ

An MDSQ with $M$ descriptions may be described by $M$ side partitions which induce $2^M - M - 1$ non-trivial *intersection partitions* (the analogues of the central partition from 2DSQ). In this section, we assume that the packet-loss scenarios corresponding to all of these intersection partitions occur with nonzero probability and thus that all are constrained; that assumption is relaxed in Sec. V. We describe each possible packet-loss scenario by a binary vector of length $M$ (called the *packet-loss vector*); in this vector, bit $i$ is 1 if packet $i$ is received and 0 if packet $i$ is lost in the corresponding scenario. (For example, packet-loss vector (1101) describes the scenario where, of an initial 4 packets, all but packet 3 are received.) Side and intersection partitions can be indexed according to the same scheme (e.g., $\mathcal{P}_{(0010)}$ is the side partition used to describe packet 3 out of 4, while $\mathcal{P}_{(1101)}$ is the intersection partition corresponding to combined knowledge of packets 1, 2, and 4).

In this case, the achievable rate-distortion points are $$\mathcal{D}^{vr} = \{(R(\mathcal{P}_{0^{i-1}10^{M-i}})|_{i=1}^M, D(\mathcal{P}_\sigma)|_{\sigma \in B^M})\},$$

and $M$ side-partitions that together achieve a point on the lower convex hull of $\mathcal{D}^{vr}$ minimize the Lagrangian $$J^{vr}(\underline{\mathcal{P}}, \underline{\nu}, \underline{\lambda}) = \sum_{\sigma \in B^M} \nu_\sigma D(\mathcal{P}_\sigma) + \sum_{i=1}^M \lambda_i R(\mathcal{P}_{0^{i-1}10^{M-i}})$$

for some positive vectors $\underline{\nu}$ and $\underline{\lambda}$. Here $B = \{0,1\}$ is the binary alphabet; $\sigma$ is a binary vector of length $M$ (a packet-loss scenario), which serves as an index in vectors $\underline{\mathcal{P}}$ (partitions) and $\underline{\nu}$ (distortion multipliers); and $\underline{\nu}$ and $\underline{\lambda}$ are distortion and rate multipliers of dimensions $2^M$ (for the $2^M$ packet-loss scenarios) and $M$ (for the $M$ description rates), respectively. (For trivial intersection partition $\mathcal{P}_{(0\ 0)}$, $D(\mathcal{P}_{(0\ 0)})$ is independent of the side partitions and $\nu_{(0\ 0)}$ is arbitrary.) We use $J^{vr}(\underline{\mathcal{P}}, \underline{\nu}, \underline{\lambda})$ as the optimization criterion for variable-rate MDSQ design.

To generalize our graph construction, we must generalize our partition extension rule and arc weight definitions. The partition extension rule generalization keeps the maximum lag between any two partitions less than or equal to 1 and fixes an order for breaking ties; we extend the shortest side partition, and if there are ties, we pick the competitor with the smallest index. Extending exactly one partition at a time according to the above extension rule implies that one side codegroup is added and at most $2^{M-1} - 1$ *intersection codegroups* are generated, resulting in at most $2^{M-1}$ distortion terms and one rate term in each arc weight.

More specifically, consider an arc $(u,v)$ from vertex $u = (u_1, u_2, \ldots, u_M)$ to vertex $v = (v_1, v_2, \ldots, v_M)$. The extension rule implies that $u$ and $v$ may differ in only one component ($u_i = v_i$ except for $i = j$). Furthermore, $u_j$ must be the shortest coordinate of vertex $u$ (up to a possible tie), giving $u_j \leq u_i$ for all $i$. If there are ties ($u_j = u_l = v_l$ for some $l \neq j$), then necessarily $j < l$. In either case, side codegroup $C_{u_j+1 \cdots v_j}$ is added (at a Lagrangian cost of $\lambda_j r(C) + \nu_{(0^j-1 0^{M-j})} d(C)$). Moreover, for each packet loss scenario $\sigma \in B^M$, if $\sigma_j = 1$, then intersection codegroup $C_{u_*+1 \cdots v_*}$ where $v_* = \min\{v_i : \sigma_i = 1\}$ is generated in intersection partition $\mathcal{P}_\sigma$ (at cost $\nu_\sigma d(C)$); otherwise no codegroups are generated in $\mathcal{P}_\sigma$. Adding up the Lagrangian costs from the side codegroup and any possible intersection codegroups gives the weight for arc $(u,v)$; note that only the side codegroup contributes rate to the total cost (thus there is a single rate term in the arc weight).

Some of the $(\hat{N}+1)^M$ vertices are inaccessible due to the extension rule. Consider vertex $v$. If $v_i = 0$ for some $i$, then either $v_j = 0$ for all $j > i$, or else the vertex is inaccessible since access to that vertex would require extending partition $j$ before extending partition $i$, even though $j > i$ (contradicting the extension rule). It turns out that this necessary condition is also sufficient for accessibility. Any accessible vertex $v = (v_1, v_2, \ldots, v_j, 0, \ldots, 0)$ can be obtained in $j$ steps starting from $(0, \ldots, 0)$: at step $i$, extend side partition $i$ from 0 to $v_i$, for $i$ from 1 to $j$.

In the course of the shortest path algorithm, one of the required steps is to obtain the ancestor set of a vertex $v$. Assume that side partition $j$ has been extended. Since $u_j < v_j$, and $u_j = \min\{u_i\}$, we get $u_j \leq \min\{v_i\}$. If there are no ties, the inequality must be strict. If there are ties, then one of the tiers, namely $u_j$, has been extended, but the other tiers are unchanged, so $u_j = \min\{v_i\}$ and $u_j$ must be the tier with the least index in $u$. In summary, if $v_l$ is the shortest component of $v$ (if there are ties, choose the one with the least index, i.e., minimize $l$) Then $v$ has $Mv_l + l - 1$ ancestors: $Mv_l$ "untied" ancestors ($j \in 1 \cdots M$ and $u_j \in 0 \cdots v_l - 1$) and $l-1$ "tied" ancestors ($j \in 1 \cdots l-1$ and $u_j = v_l$). When $v_l = 0$ all ancestors are "tied."

The size of the ancestor set of a given vertex equals its in-degree, therefore the number determined above can be plugged directly into the topological sorting algorithm. A slight simplification is possible. If we eliminate inaccessible vertices from the graph, then the origin is the only remaining vertex with in-degree zero, making initialization trivial for both the topological sorting and the dynamic programming stages of the shortest path algorithm. We also need to do away with inaccessible ancestors in our account. If $v_l > 0$, this means that $u_j = 0$ is permitted only for $j = M - 1$, thus leaving $M(v_l - 1) + l$ accessible ancestors; if $v_l = 0$ but $l > 0$, then only one ancestor is accessible, with $j = l - 1$ and $u_j = 0$; finally if $l = v_l = 0$ then $v$ is the origin, which has no ancestors.

The computational complexity of the algorithm depends on the size of the vertex set and edge set of the partial RD graph. With $M$ descriptions, there are $(\hat{N}+1)^M$ vertices; each vertex has at most $\hat{N}$ outgoing arcs, thus there are $O((\hat{N}+1)^{M+1})$ edges. The complexity of computing the arc weights dominates all the other steps of the design process. In general up to $2^{M-1}$ codegroups are generated for each edge, and determining the boundaries of each codegroup requires examining at most $M$ coordinates; the computational complexity is $O(M(2(\hat{N}+1))^{M+1})$.

Fixed-Rate MDSQ

In fixed-rate MDSQ design, the side-partition sizes are fixed and the rate of each description equals the logarithm of the corresponding side-partition size. Let $d_k$ be the fixed size of partition $\mathcal{P}_{0^k-1 0^{M-k}}$. Then $$\mathcal{D}^{fr}(\underline{d}) = \{(D(\mathcal{P}_\sigma))_{\sigma \in B^M} : |\mathcal{P}_{0^k-1 0^{M-k}}| \leq d_k \ \forall i\}$$

describes the set of achievable distortion points at fixed rate $(\log d_1, \ldots, \log d_M)$. In this case, $M$ side-partitions achieving a point on the lower convex hull of $\mathcal{D}^{fr}$ minimize the Lagrangian performance measure $$J^{fr}(\underline{\mathcal{P}}, \underline{d}, \underline{\nu}) = \sum_{\sigma \in B^M} \nu_\sigma D(\mathcal{P}_\sigma)$$

for some positive vector $\underline{\nu}$. We use $J^{fr}(\underline{\mathcal{P}}, \underline{\nu})$ as the optimization criterion for fixed-rate MDSQ design.

The problem of fixed-rate MDSQ design differs from that of variable-rate MDSQ design both in the optimization criterion and in the constraint on the size of each side partition. While the first difference affects only the edge weights of the partial RD graph, the second difference affects the node definitions. Let node $((v_1, s_1), \ldots, (v_M, s_M))$ represent the set of all possible collections of $M$ side-partitions $(\mathcal{P}_1, \ldots, \mathcal{P}_M)$ such that $\mathcal{P}_i$ spans $0 \cdots v_i$ with $|\mathcal{P}_i| = s_i$ segments. The partition extension rule is generalized accordingly, again keeping the lag between any two side partitions to at most 1 and here updating the partition size parameters appropriately.

Specifically, we have $(\hat{N}+1)^M \prod_{i=1}^M (c_i + 1)$ vertices $\{((v_1, s_1), \ldots, (v_M, s_M))\}_{v_i \in 0 \cdots \hat{N}, s_i \in 0 \cdots c_i}$. (The extension rule makes some of the vertices inaccessible.) For any arc $(u,v)$ from vertex $u = ((u_1, r_1), \ldots, (u_M, r_M))$ to vertex $v = ((v_1, s_1), \ldots, (v_M, s_M))$, the extension rule again implies that $u_i = v_i$ and $r_i = s_i$ for all $i \neq j$, $u_j \leq u_i$ for all $i$, and $j < l$ for any $l$ such that $u_j = u_l = v_l$. Further, since arc $(u,v)$ corresponds to the addition of a single side codegroup to the $j$th partition, $s_j = r_j + 1$. For any $\sigma \in B^M$ with $\sigma_j = 1$, arc $(u,v)$ implies the addition of codegroup $C_{u_*+1 \cdots v_*}$ ($v_* = \min\{v_i : \sigma_i = 1\}$) to partition $\mathcal{P}_\sigma$ at Lagrangian cost $\nu_\sigma d(C_{u_*+1 \cdots v_*})$. Adding these Lagrangian costs gives the weight for arc $(u,v)$. Fixed-rate MDSQ optimization is equivalent to finding the shortest path from $((0,0), \ldots, (0,0))$ to $((\hat{N}, c_1), \ldots, (\hat{N}, c_M))$.

V. MRSQ AND OTHER RESTRICTED MDSQs

Throughout this work, we rely on the implicit assumption that the decoder must be able to uniquely decode the data description it receives. Combining that implicit assumption with Sec. IV's explicit assumption that all packet-loss scenarios of an MDSQ occur with non-zero probability implies an entropy lower bound on the rate required to describe each packet. In particular, since packet-loss scenario $\sigma(i) = (0^{i-1}10^{M-i})$ occurs with non-zero probability for each $i \in 1 \cdots M$, $\{r(C) : C \in \mathcal{P}_{\sigma(i)}\}$ must satisfy Kraft's inequality for each $i \in 1 \cdots M$. (To satisfy Kraft's inequality on $\{r(C) : C \in \mathcal{P}_\sigma\}$ for all $\sigma \in B^M$, it is both necessary and sufficient to satisfy Kraft's inequality on the side-partition descriptions.) Thus for any $C \in \mathcal{P}_{\sigma(i)}$, $r(C) = p(C) \log |\mathcal{P}|$ and $r(C) = -p(C) \log p(C)$ are optimal for fixed- and variable-rate coding, respectively.

In this section, we replace the assumption that any packet-loss scenario $\sigma \in B^M$ occurs with non-zero probability by the assumption that only $\sigma$ in some *admissible scenario set* $\Sigma \subseteq B^M$ occur with non-zero probability. Under this new assumption, the optimal rate for describing a side-partition with fixed- and variable-rate codes varies with $\Sigma$. We begin by studying multi-resoultion codes ($\Sigma = \{(1^i 0^{M-i}) : i \in 1 \cdots M\}$) and then generalize to a broader class of admissible scenario sets.

Again, we focus initially on variable-rate codes, leaving the discussion of fixed-rate coding to the end of the section.

MRSQ Overview

In MRSQ, packet $i$ is never received without packets $1 \cdots i - 1$, giving $\Sigma = \{(1^i 0^{M-i}) : i \in 1 \cdots M\}$. Let $\mathcal{P}_i = \mathcal{P}_{(1^i 0^{M-i})}$ for each $i \in 1 \cdots M$; then $\{r(C) : C \in \mathcal{P}_i\}$ must satisfy Kraft's inequality for each $i \in 1 \cdots M$, but $\{r(C) : C \in \mathcal{P}_{\sigma(i)}\}$ need not satisfy Kraft's inequality for any $i > 1$. We begin by examining the partitions $\{\mathcal{P}_i\}_{i=1}^M$.

By definition of the intersection partitions, for each $C \in \mathcal{P}_i$, $C = \cap_{j=1}^i C_j$ for some $C_j \in \mathcal{P}_{\sigma(j)}$, $j \in 1 \cdots i$. Thus for each $i \in 1 \cdots M$, partition $\mathcal{P}_i$ is a *refinement* of $\mathcal{P}_{i-1}$; that is, the threshold sequence of $\mathcal{P}_{i-1}$ is a subsequence of the threshold sequence of $\mathcal{P}_i$. (Here $\mathcal{P}_0 = 1 \cdots \hat{N}$ by definition.) Since $\mathcal{P}_i$ refines $\mathcal{P}_{i-1}$ (written $\mathcal{P}_i \succeq \mathcal{P}_{i-1}$), for any $C \in \mathcal{P}_{i-1}$ there exists a collection of cells $c_1 \cdots c_k \in \mathcal{P}_i$ so that $\mathcal{P}_i(C) = c_1 \cdots c_k$ is a partition of $C$. Fig. 7 shows the refinement relationship betwen partitions $\mathcal{P}_1$ and $\mathcal{P}_2$.

The restriction that $\{r(C) : C \in \mathcal{P}_i\}$ satisfies Kraft's inequality for each $i \in 1 \cdots M$ implies that the decoder can uniquely decode the description of some $C \in \mathcal{P}_{i-1}$ before decoding the $i$th incremental description; as a result, the observation that $\mathcal{P}_i$ refines $\mathcal{P}_{i-1}$ implies that the $i$th incremental description need only distinguish between the members of $\mathcal{P}_i(C)$ rather than all of the members of $\mathcal{P}_i$. Unique decodability in an MRSQ is achieved if and only if $\{r(c) : c \in \mathcal{P}_i(C)\}$ satisfies Kraft's inequality for each $i \in 1 \cdots M$ and $C \in \mathcal{P}_{i-1}$. The optimal rate for describing cell $c \in \mathcal{P}_i(C)$ given a prior description of the cell $C \in \mathcal{P}_{i-1}$ that it refines is $r(c|C) = -p(c|C) \log p(c|C)$, where

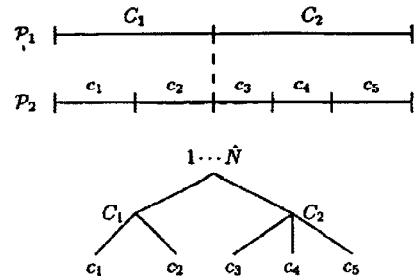

Fig. 7. Successive refinement of partitions in an MRSQ. In this example, $\mathcal{P}_2(C_1) = \{c_1, c_2\}$ and $\mathcal{P}_2(C_2) = \{c_3, c_4, c_5\}$. The decoder describes an $M$-step path from the root to a leaf in the tree structure, uniquely describing the $i$th step in the $i$ incremental description.

$p(c|C) = p(c)/p(C)$. The expected $i$th-resolution rate is $$R(\mathcal{P}_i | \mathcal{P}_{i-1}) = - \sum_{C \in \mathcal{P}_{i-1}} p(C) \sum_{c \in \mathcal{P}_i(C)} p(c|C) \log p(c|C).$$

This *conditional* entropy bound on the expected rate is approximated in practice by conditional entropy codes.

Target Function

The rate-distortion points achievable by variable-rate MRSQs are $$\mathcal{D}^{vr} = \{(R(\mathcal{P}_i | \mathcal{P}_{i-1}), D(\mathcal{P}_i))|_{i=1}^M : \mathcal{P}_M \succeq \cdots \succeq \mathcal{P}_0\},$$

and $M$ successively refined partitions that together achieve a point on the lower convex hull of $\mathcal{D}^{vr}$ minimize the Lagrangian $$J^{vr}(\underline{\mathcal{P}}, \underline{\nu}, \underline{\lambda}) = \sum_{i=1}^M [\nu_i D(\mathcal{P}_i) + \lambda_i R(\mathcal{P}_i | \mathcal{P}_{i-1})] \quad (2)$$

for some positive vectors $\underline{\nu} = \{\nu_i\}_{i=1}^M$ and $\underline{\lambda} = \{\lambda_i\}_{i=1}^M$. We therefore use $J^{vr}(\underline{\mathcal{P}}, \underline{\nu}, \underline{\lambda})$ as our design criterion. Note that $$J^{vr}(\underline{\mathcal{P}}, \underline{\nu}, \underline{\lambda})$$

$$\stackrel{(a)}{=} \sum_{i=1}^M \sum_{C \in \mathcal{P}_{i-1}} \sum_{c \in \mathcal{P}_i(C)} [\nu_i d(c) + \lambda_i p(C) r(c|C)]$$

$$\stackrel{(b)}{=} \sum_{i=1}^M \sum_{C \in \mathcal{P}_{i-1}} \sum_{c \in \mathcal{P}_i(C)} \left[\nu_i d(c) + \lambda_i p(c) \log \frac{p(C)}{p(c)}\right]$$

$$\stackrel{(c)}{=} \sum_{i=1}^M \sum_{C \in \mathcal{P}_{i-1}} \left[-\lambda_i r(C) + \sum_{c \in \mathcal{P}_i(C)} [\nu_i d(c) + \lambda_i r(c)]\right]$$

$$\stackrel{(d)}{=} \sum_{i=1}^M \sum_{C \in \mathcal{P}_{i-1}} \sum_{c \in \mathcal{P}_i(C)} [\nu_i d(c) + (\lambda_i - \lambda_{i+1}) r(c)],$$

where (a) and (b) expand the terms in (2); (c) follows from $\sum_{c \in \mathcal{P}_i(C)} p(c) = p(C)$; and (d) uses the definition $\lambda_{M+1} =$ 0 and the fact that $\mathcal{P}_0$ has only one cell $C$ with $r(C) = 0$. We express the design criterion recursively as $$J^{(i-1)}(C) = \sum_{c \in \mathcal{P}_i(C)} [\nu_i d(c) + (\lambda_i - \lambda_{i+1})r(c) + J^{(i)}(c)] \quad (3)$$

with $J^{(M)}(c) = 0$ for all $c$ and $J^{vt}(\underline{\mathcal{P}}, \underline{\nu}, \underline{\lambda}) = J^{(0)}(1 \cdots \hat{N})$.

Algorithm

The design algorithm finds the set of successively refined partitions $\underline{\mathcal{P}}$ (compatible with the coarse grid $\mathcal{G}$) that minimizes $J^{(0)}(1 \cdots \hat{N})$ for a fixed collection of Lagrangian parameters $\underline{\lambda}$ and $\underline{\nu}$. Notice that for $J^{(i-1)}(C)$ to be optimal, $J^{(i)}(c)$ must be optimal for each $c \in \mathcal{P}_i(C)$; each of the $J^{(i)}(c)$ terms in the equation for $J^{(i-1)}(C)$ can be optimized independently of the others since the cells $c$ in $\mathcal{P}_i(C)$ do not overlap. These observations suggest a bottom-up dynamic programming solution. For any possible codegroup $C$, we can find the partition $\mathcal{P}_M(C)$ of $C$ that minimizes $$J^{(M-1)}(C) = \sum_{c \in \mathcal{P}_M(C)} [\nu_M d(c) + (\lambda_M - \lambda_{M+1})r(c)]$$

using a shortest path algorithm like the one used for ECSQ design. Given $J^{(M-1)}(\cdot)$ for all $\mathcal{G}$-compatible codegroups, we similarly find $\mathcal{P}_{M-1}(C)$ for each $C$ by minimizing $$J^{(M-2)}(C) = \sum_{c \in \mathcal{P}_{M-1}(C)} \left[ \nu_{M-1} d(c) + (\lambda_{M-1} - \lambda_M)r(c) + J^{(M-1)}(c) \right].$$

Iterating back to $i = 0$ yields $J^{(0)}(1 \cdots \hat{N}) = J^{vt}(\underline{\mathcal{P}}, \underline{\nu}, \underline{\lambda})$.

More formally, we begin by initializing $J^{(M)}(C) = 0$ for all $C = C_{a \cdots b}$ with $a, b \in 1 \cdots \hat{N}$. We then proceed through $M$ iterations, indexed from $M - 1$ to $0$. Each iteration relies on a different partial RD graph. In iteration $i$, for all $\mathcal{G}$-compatible codegroups $C$ we compute and store the sub-partition $\mathcal{P}_i(C)$ that minimizes $J^{(i)}(C)$. The optimal $J^{(i)}(C)$ is found by running the shortest-path algorithm between each pair of distinct vertices in a graph with weight $$w_{i-1}[v, v'] = \nu_i d(C_{v+1 \cdots v'}) + (\lambda_i - \lambda_{i+1})r(C_{v+1 \cdots v'}) + J^{(i)}(C_{v+1 \cdots v'})$$

on the arc from node $v$ to node $v'$ $(v, v' \in 0 \cdots \hat{N})$. Here $J^{(i)}(C_{v+1 \cdots v'})$ is the weight on the shortest path from node $v$ to node $v'$ using arc weights $\{w_i[a,b]\}_{a,b=0}^{\hat{N}}$; that shortest path is known from the previous iteration. (We implicitly use the two-way correspondence between arc $(v, v')$ and codegroups $C_{v+1 \cdots v'}$.) The final results of the algorithm are $J^{(0)}(1 \cdots \hat{N})$ and the successively refined partitions $\mathcal{P}_1 \cdots \mathcal{P}_M$ that achieve it. Partition $\mathcal{P}_i$ is constructed from $\mathcal{P}_{i-1}$ by pasting together $\mathcal{P}_i(C)$ for all $C \in \mathcal{P}_{i-1}$.

An important improvement involves running an *all-pairs shortest path* algorithm once at each level rather than running the shortest path algorithm between each pair of vertices in $0 \cdots \hat{N}$. This reduces the complexity from $O((\hat{N} + 1)^4)$ to $O((\hat{N} + 1)^3)$ per iteration (see [12]). The overall complexity is $O(M(\hat{N} + 1)^3)$.

Restricted MDSQ

We next modify the general MDSQ design algorithm for use with more general scenario sets. The modifications greatly increase computational complexity, but not beyond the polynomial landmark (in terms of alphabet symbols). Since there exist more efficient specialized algorithms for some restricted-MDSQ scenarios (e.g., the above bottom-up dynamic programming algorithm for MRSQ design), the generalization is not of interest for all values of $\Sigma$. It does, however, increase the collection of scenario sets for which we can perform optimal design.

In MRSQ, packet $i$ never arrives without packets $1 \cdots i-1$, so we can save rate by allowing packet $i$'s description to depend on the descriptions of prior packets. The *dependency sets* $\{\delta[i]\}_{i=1}^M$ capture a similar property for general restricted MDSQs. Packet $i$ *depends* on packet $j$ ($j \in \delta[i]$) if $i$ is never received without $j$ (i.e., $\sigma_i = 1$ implies $\sigma_j = 1$ for all admissible scenarios $\sigma \in \Sigma$). We call any $j \in \delta[i]$ a *requisite* of $i$, and we say that packet $i$ is *independent* if $\delta[i] = \phi$. For example, in a 3RSQ $\Sigma = \{(100), (110), (111)\}$, $\delta[1] = \phi$, $\delta[2] = \{1\}$, and $\delta[3] = \{1, 2\}$.

In MRSQ, if packet $i$ depends on $j$, then partition $\mathcal{P}_i$ must be a refinement of $\mathcal{P}_j$, and the optimal rates are the corresponding conditional entropies. Similar refinement relationships and conditional lossless codes also arise in other restricted MDSQs, and the algorithm that follows uses the dependency sets $\{\delta[i]\}_{i=1}^M$ to determine these relationships.

While knowing the dependency sets is sufficient for finding the optimal restricted MDSQ for many scenario sets, dependency sets capture only the simplest type of dependence, and thus the algorithm discussed below does not guarantee the optimal solution for all scenario sets. For example, consider the scenario set $\Sigma = \{001, 010, 101, 110\}$. Here packet 1 is guaranteed to appear with either packet 2 or packet 3. Yet $\delta[1] = \phi$, and thus the algorithm that follows treats packet 1 as an independent packet, calculating its rate as the full entropy of $\mathcal{P}_{\sigma(i)}$. Since this entropy is not necessarily optimal [19], the algorithm guarantees an optimal solution only for examples characterized entirely by the simple dependencies captured by $\delta$. Examples of scenario sets covered here but not covered previously include $\Sigma = \{(100), (110), (001), (101), (111)\}$ (a 2RSQ plus an independent packet) and $\Sigma = \{(100), (110), (101)\}$ (packets 2 and 3 never appear without 1).

One way to compute the dependency sets is to check whether $j \in \delta[i]$ for all pairs $i, j \in 1 \cdots M$ with $i \neq j$ by examining all $\sigma \in \Sigma$; this procedure takes $O(M^2|\Sigma|)$ operations, giving $O(M^2 2^M)$ in the worst case. There is not much room for improvement here since any algorithm must visit each admissible scenario at least once.

The dependency function $\delta$ implicitly defines a (directed) *dependency graph* with $M$ vertices and an arc from $i$ to $j$ if $i$ depends on $j$ ($j \in \delta[i]$). An example appears in Fig. 8. (We remove the dotted arcs in the discussion that follows, but for now they are part of the graph). There are no restrictions on the in- and out-degrees of each vertex (i.e., one packet can depend on many others and multiple packets can depend on the same packet). For any two mutually-

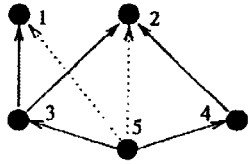

Fig. 8. The dependency graph for $\Sigma = \{10000, 01000, 11100, 01010, 11110, 11101, 11111\}$; dashed lines show indirect dependencies.

dependent packets $i$ and $j$, we replace $i$ and $j$ with a new "joint" packet $k$; since all packets are jointly encoded and $i$ and $j$ can always be jointly decoded, the rate needed to describe the new packet $k$ can be broken up arbitrarily between the two original packets $i$ and $j$.

We sort the vertices of the graph (the packets) topologically, renumbering them so that if $i$ is dependent on $j$, then $i > j$. (Since all mutually-dependent packets are merged, the graph is guaranteed to be acyclic.) The ordering is useful for the design stage, where we again use a tie-breaking rule that extends the competitor with the least index.

We calculate the rate of dependent packets using the corresponding conditional entropies. To calculate these conditional entropies, we enforce refinement relationships on some of the side partitions. In MRSQs, if packet $i$ depends on $j$, then $\mathcal{P}_i$ must be a refinement of $\mathcal{P}_j$. In general restricted MDSQs, if packet $i$ depends on $j$, then for each $\sigma, \sigma' \in \Sigma$ with $\sigma_i = \sigma_j = 1$, $\sigma'_i = 0$, and $\sigma'_k = \sigma_k$ ($k \neq i$), $\mathcal{P}_\sigma$ must be a refinement of $\mathcal{P}_{\sigma'}$. Unfortunately, this refinement relationship between intersection partitions implies no refinement relationships between side partitions. In fact, refinement relationships are not necessary in the side partitions of dependent packets. We next show, however, that considering only side partitions for which $j \in \delta[i]$ implies $\mathcal{P}_{\sigma(i)}$ refines $\mathcal{P}_{\sigma(j)}$ causes no loss of generality.

Notice that for any $\Sigma \subset B^M$, the set of side partitions $\{\mathcal{P}_{\sigma(i)}\}_{i=1}^M$ that yields the full partition set $\{\mathcal{P}_\sigma\}_{\sigma \in \Sigma}$ is not necessarily unique. Further, for any full partition set $\{\mathcal{P}'_\sigma\}_{\sigma \in \Sigma}$ derived from arbitrary side partition set $\{\mathcal{P}'_{\sigma(i)}\}_{i=1}^M$, there exists another collection of side partitions $\{\mathcal{P}_{\sigma(i)}\}_{i=1}^M$ for which $\{\mathcal{P}_\sigma\}_{\sigma \in \Sigma} = \{\mathcal{P}'_\sigma\}_{\sigma \in \Sigma}$ and $j \in \delta[i]$ implies $\mathcal{P}_{\sigma(i)} \succeq \mathcal{P}_{\sigma(j)}$. We construct $\{\mathcal{P}_{\sigma(i)}\}_{i=1}^M$ as $\mathcal{P}_{\sigma(i)} = \mathcal{P}'_{\tilde{\sigma}(i)}$, where $\tilde{\sigma}_j(i) = 1$ for all $j \in \delta[i] \cup \{i\}$ and $\tilde{\sigma}_j(i) = 0$ otherwise. Here $\{\mathcal{P}_\sigma\}_{\sigma \in \Sigma} = \{\mathcal{P}'_\sigma\}_{\sigma \in \Sigma}$ follows since packet $i$ never appears without its requisite packets.

Since refinement is transitive ($\mathcal{P}_{\sigma(i)} \succeq \mathcal{P}_{\sigma(j)}$ and $\mathcal{P}_{\sigma(j)} \succeq \mathcal{P}_{\sigma(l)}$ implies $\mathcal{P}_{\sigma(i)} \succeq \mathcal{P}_{\sigma(l)}$), some of the refinement relationships contained in the initial dependency graph are superfluous. We say that $j$ depends directly on $i$ (and write $j \in \Delta[i]$) if and only if $j$ depends on $i$ ($j \in \delta[i]$) and $j$ does not depend on any other node $l$ that also depends on $i$ (there does not exist a $l \in \delta[i]$ such that $j \in \delta[l]$). We remove all but the direct depencies. From a graph-theoretical perspective, this operation is the inverse of the transitive closure problem on the dependency graph.

We are now ready to extend the MDSQ design algorithm.

First, we modify the partition extension rule to ensure successive refinement according to $\Delta$. Since the packets are sorted topologically, dependent packets have higher indices, and their partitions are extended only after those of their requisites. To preserve refinement, we make sure that cells added to dependent partitions never "cross" boundaries of cells already present in requisite partitions. Since codegroup lag is always 1 or 0, the only place where such a crossing might occur is at the end of a requisite partition. Therefore we remove from the partial RD graph any arc that extends a dependent partition beyond the end of any of its requisite partitions.

Since arc costs for codegroups added to dependent partitions measure rate as conditional entropy, we must modify the partial RD graph to include information about the "parent" codegroups in all requisite partitions. Given the bound on codegroup lag, each "parent" is the last codegroup in its respective partition. Thus for each packet with dependents, we modify the vertex label to describe not only the end of the corresponding partition but also the beginning of the final codegroup in that partition; thus instead of keeping track of only the last element in the threshold sequence for that partition, we keep track of the last two elements. This double-labeling increases the number of vertices from $(\dot{N}+1)^M$ to $O((\dot{N}+1)^{2M})$ in the worst case.

Each (single or double) partition label is a component in the $M$-dimensional label for a vertex; partition labels are elements of $1 \cdots N \cup (1 \cdots N)^2$, so vertex labels are elements of $(1 \cdots N \cup (1 \cdots N)^2)^M$. As an example, if $\delta[1] = \delta[3] = \phi$ and $\delta[2] = 1$ (packets 1 and 3 are independent, while packet 2 depends on 1), a vertex label might look like $((v_1, v'_1), v_2, v_3) = ((2,5), 1, 7)$ - corresponding to partitions $\mathcal{P}_{\sigma(1)}$ extending up to grid cell 5, with its final codegroup starting at cell 3, $\mathcal{P}_{\sigma(2)}$ extending up to grid cell 1, and $\mathcal{P}_{\sigma(3)}$ up to cell 7. As illustrated in this example, double-labels $(v_i, v'_i)$ consist of the last two elements in the threshold sequence of partition $\mathcal{P}_{\sigma(i)}$ (corresponding to a final codegroup $C_{v_i+1\cdots v'_i}$); an exceptional situation arises when the partition is empty (the threshold sequence has only one element) in which case we use the label $(0,0)$.

All other partition extension rules remain valid once we realize that the second element in a double-label denotes the end of a partition — in particular this is how we measure the length of a partition when determining which partition in a tuple is the shortest. The introduction of double labels raises three new issues. First, the successor set of a vertex may involve extending a double-labeled partition, in which case the following rule applies: double-labeled partition $\mathcal{P}_{\sigma(i)}$ can be extended from $(v_i, v'_i)$ to $(v'_i, v''_i)$ where $v''_i > v'_i$ (provided all the other extension rules are obeyed). Second, the ancestor set of a vertex may involve "shortening" a double-labeled partition $\mathcal{P}_{\sigma(i)}$; $(v'_i, v''_i)$ can be shortened to $(v_i, v'_i)$ where either $v_i < v'_i$ or $v_i = v'_i = 0$.

Finally, the weight on the arcs associated with dependent packets in the partial RD graph must be changed to use conditional entropy in the rate calculations (distortion terms are left unchanged). As noted in Section IV, only side-codegroups contribute rate terms to the Lagrangian cost. Given the double labels on requisite packets and the enforced refinement condition for dependent side partitions, for any packet $i$, any codegroup $c \in \mathcal{P}_{\sigma(i)}$, and any requisite packet $j \in \delta[i]$, the "parent" codegroup $C_j \in \mathcal{P}_{\sigma(j)}$ with $c \subseteq C_j$ is described by the double label index for packet $j$. Since this parent codegroup is known, we can calculate the optimal rate for describing packet $c$ given descriptions of $\{C_j\}_{j \in \delta[i]}$ as $$r(c|C_j, j \in \delta[i]) = -p(c|C_j, j \in \delta[i]) \log p(c|C_j, j \in \delta[i]),$$

giving a total rate contribution for group $c$ equal to $$p(C_j, j \in \delta[i]) r(c|C_j, j \in \delta[i]) = -p(c) \log p(c|C_j, j \in \delta[i]).$$

Here $p(c|C_j, j \in \delta[i]) = p(c)/p(C_j, j \in \delta[i])$ and $p(C_j, j \in \delta[i]) = p(\cap_{j \in \delta[i]} C_j)$.

Fixed-Rate Coding

The extension to fixed-rate code design proceeds in a manner similar to the one described in Section IV. Again, the side-partition sizes are fixed, the nodes of the partial RD graph are modified to include partition sizes, and the entropies and conditional entropies are replaced by the corresponding log-cardinalities.

VI. DECODER SIDE-INFORMATION

We next consider the design of scalar quantizers with decoder side-information. The proposed approach allows the incorporation of decoder side-information in any of the above coding scenarios, yielding fixed- and variable-rate SQs with decoder side-information (Wyner-Ziv codes), MRSQs with decoder side-information, and MDSQs with decoder side-information. We illustrate the generalization to side-information codes within the ECSQ framework, demonstrating optimal side-information ECSQ (SECSQ) design. The approach for incorporating decoder side-information into ECSQ design generalizes to the other coding environments as discussed at the end of this section.

ECSQ with Decoder Side-Information

Let $\mathcal{X}$ and $\mathcal{Y}$ denote the ordered, scalar source and side-information alphabets, respectively. We assume either a known joint distribution on finite alphabets or a finite training set on alphabets of unrestricted size. In either case, $\mathcal{X} \times \mathcal{Y}$ is effectively finite, and the joint pmf (or its empirical estimate) on this product alphabet is known. Let the source- and side-information-alphabet sizes be $N(\mathcal{X})$ and $N(\mathcal{Y})$, respectively. Then $\mathcal{X} = \{x_1, \ldots, x_{N(\mathcal{X})}\}$ and $\mathcal{Y} = \{y_1, \ldots, y_{N(\mathcal{Y})}\}$. We refer to source symbol $x_n$ by its index $n \in 1 \cdots N(\mathcal{X})$ and side-information symbol $y_m$ by its index $m \in 1 \cdots N(\mathcal{Y})$. Given joint probability $p[n, m]$ of $(x_n, y_m)$, $p[m] = \sum_{n=1}^{N(\mathcal{X})} p[n, m]$ is the probability of $y_m$. Any side-information symbol $m$ with zero probability can be excluded from $\mathcal{Y}$ without loss of generality. After all zero-probability symbols have been removed, we can define the conditional probability $p[n|m] = p[n, m]/p[m]$ for every $m \in \mathcal{Y}$. We also define the aggregate codegroup probabilities $p(C, m) = \sum_{n \in C} p[n, m]$ and $p(C|m) = p(C)/p(m)$.

We allow the reduction of design complexity by partitioning $\mathcal{X}$ with into $\tilde{N}(\mathcal{X})$ cells and $\mathcal{Y}$ with into $\tilde{N}(\mathcal{Y})$ cells.

The SECSQ encoder, like the ECSQ encoder of Sec. III, partitions $\mathcal{X}$ into codegroups (here assumed to be contiguous). Thus optimal SECSQ design is equivalent to optimal partition design. Further, since the expected distortion and expected rate for an encoder defined by partition $\mathcal{P}$ of $\mathcal{X}$ are additive over the codegroups of $\mathcal{P}$ we can once again define a partial RD graph to make optimal partition design equivalent to a shortest path problem. The only difference between the partial RD graph for SECSQ and the the partial RD graph for ECSQ lies in the weight calculations.

The expected distortion of the SECSQ defined by partition $\mathcal{P}$ is $D_S(\mathcal{P}) = \sum_{C \in \mathcal{P}} d_S(C)$. Here $$d_S(C) = \sum_{m=1}^{N(\mathcal{Y})} p[m] \sum_{n \in C} p[n|m] d(x_n, \mu(C, m)),$$

where $\mu(C, m)$, the codeword for codegroup $C$ and side-information $y_m$, is fully determined by the conditional distribution $p[n|m]$ on symbols $n \in C$. When $d(x, \hat{x}) = (x - \hat{x})^2$, the centroid $\mu(C, m) = \sum_{n \in C} p[n|m] x_n / p[C|m]$ of $C$ with respect to pmf $p[n|m]$ yields the optimal performance.

In calculating the partial rate, we assume the use of a rate-$H(X|Y)$ Slepian-Wolf code to describe $X$ to a decoder that knows $Y$ [20]. While rate $H(X|Y)$ may not be achievable with probability of error $P_e = 0$, we can design codes that approach rate $H(X|Y)$ arbitrarily closely using a $P_e < \epsilon$ for any $\epsilon > 0$ [21]. Given assumptions of a finite alphabet and bounded distortion measure, the increase in distortion caused by a nonzero error probability can be made arbitrarily small. Thus the expected rate of the SECSQ defined by partition $\mathcal{P}$ is $R_S(\mathcal{P}) = \sum_{C \in \mathcal{P}} r_S(C)$ with partial rate $$r_S(C) = -\sum_{m=1}^{N(\mathcal{Y})} p[m] p(C|m) \log p(C|m)$$

The SECSQ optimization criterion is the Lagrangian $$J(\mathcal{P}, \lambda) = D_S(\mathcal{P}) + \lambda R_S(\mathcal{P})$$

The weight on arc $(u, v)$ of the partial RD graph is therefore defined as $d_S(C_{u+1 \cdot v}) + \lambda r_S(C_{u+1 \cdot v})$. Given these modified weights, the design procedure is identical to the ECSQ design procedure.

Note that both $r_S(C)$ and $d_S(C)$ are expressed as weighted sums of $N(\mathcal{Y})$ terms, where each term is a function of the conditional pmf $p[n|m]$ and has a weight of $p[m]$. The individual terms look like ECSQ partial rates and distortions for a source with alphabet $\mathcal{X}$ and pmf $p[n|m]$. Therefore any preprocessing designed to speed up ECSQ arc weight determinations applies to SECSQ as well, except that we must precompute and store $N(\mathcal{Y})$ versions of the results. In particular, for the MSE we must compute and store $N(\mathcal{Y})$ cummulative moments of order 0, 1 and 2 (i.e. three sets of moments for each value of $m$). This increases the time- and space-complexity of the algorithm $N(\mathcal{Y})$ times. Additionally, we must precompute $p[m]$ and $p[n|m]$ for all $n, m$; this requires $O(N(\mathcal{X})N(\mathcal{Y}))$ additional steps and similar storage (which does not change the complexity any further).

Other Side-Information Codes

The inclusion of decoder side-information in fixed-rate SQs and fixed- and variable-rate MDSQs, MRSQs, and restricted MDSQs proceeds similarly. In each case, the design criterion and algorithm for the side-information code are identical to those of the code without side-information. The only differences are the partial rate and distortion calculations used to calculate arc weights in the partial RD graph. Without side-information, codegroup $C$ has a single codeword and contributes $d(C) = \sum_{n \in C} p[n] d(x_n, \mu(C))$ to its partition's distortion; with side-information, codegroup $C$ has a $N(\mathcal{Y})$ codewords and contributes $d_S(C) = \sum_{m=1}^{N(\mathcal{Y})} p[m] \sum_{n \in C} p[n|m] d(x_n, \mu(C, m))$ to its partition's distortion. Without side-information, variable-rate coding rates are entropies and conditional entropies; without side-information, those entropies and conditional entropies are (further) conditioned on the decoder side-information. The rates for fixed-rate codes do not change as a result of decoder side-information.

Codegroup partial rates and distortions are the same for SECSQ and all other multiple-decoder with side information systems (only the vertex labels and codegroups corresponding to each arc differ). Therefore any preprocessing techniques used for to determine SECSQ partial rates and distortions apply to the multiple-decoder with side information systems as well.

VII. CODECELL CONTIGUITY: CONDITIONS FOR OPTIMALITY

The preceding sections describe algorithms for choosing the optimal quantizer among all quantizers with contiguous codecells. This section includes the derivation of conditions under which the optimal quantizer with contiguous codecells is guaranteed to achieve performance at least as good as that of the optimal quantizer with non-contiguous codecells. We begin by considering fixed-rate and entropy-constrained SQ. We then proceed to consider fixed-rate and entropy-constrained MRSQ, MDSQ, and restricted MDSQ. Finally, we consider the impact of decoder side-information. We assume throughout that $d(x, \hat{x}) = \rho(|x - \hat{x}|)$ for some non-decreasing $\rho : [0, \infty) \to [0, \infty)$.

Scalar Quantizers

Let $\mathcal{D}^{fr} = \{(\log |\mathcal{P}|, D(\mathcal{P}))\}$ and $\mathcal{D}^{vr} = \{(R(\mathcal{P}), D(\mathcal{P}))\}$ describe the sets of expected rate-distortion points achievable through fixed-rate and entropy-constrained scalar coding (without decoder side-information) on pmf $\{p[n]\}_{n=1}^N$. A fixed-rate SQ that achieves a point on the lower boundary $D_1^{fr}(R) = \inf_{\mathcal{P}: \log |\mathcal{P}| \leq R} D(\mathcal{P})$ of $\mathcal{D}^{fr}$ is optimal in the sense that it has the lowest possible distortion among all fixed-rate SQs satisfying some rate constraint. Similarly, an ECSQ that achieves a point on the lower boundary $D_1^{vr}(R) = \inf_{\mathcal{P}: R(\mathcal{P}) \leq R} D(\mathcal{P})$ of $\mathcal{D}^{vr}$ is optimal in the sense that it has the lowest possible distortion among all ECSQs satisfying some rate constraint. While $D_1^{fr}(R)$ and $D_1^{vr}(R)$ are not convex in general and any point on the lower convex hull of $D_1^{fr}(R)$ and $D_1^{vr}(R)$ can be achieved through time-sharing, the above definitions for optimal fixed-rate SQs and ECSQs does not require performance on the convex hull of $D_1^{fr}(R)$ or $D_1^{vr}(R)$; time-sharing strategies, while low in complexity, are not strict *scalar* codes.

*Theorem 1:* Given a pmf $p[1] \cdots p[N]$ and a distortion measure $d(x, \hat{x}) = \rho(|x - \hat{x}|)$ for some non-decreasing function $\rho : [0, \infty) \to [0, \infty)$, any point $(R, D_1^{fr}(R)) \in \mathcal{D}^{fr}$ is achievable by a fixed-rate SQ with contiguous codecells.

*Proof:* We prove that for any partition $\mathcal{P} = \{c_1, \ldots, c_K\}$ with optimal codewords $\mu(c_1) \leq \cdots \leq \mu(c_K)$, there exists another partition $\mathcal{P}^*$ with contiguous codecells $\{c_k^*\}_{k=1}^K$ that satisfies $\sum_{k=1}^K \sum_{n \in c_k^*} p[n] d(x_n, \mu(c_k)) \leq D(\mathcal{P})$. Since $(R, D_1^{fr}(R)) \in \mathcal{D}^{fr}$ implies, by definition of $\mathcal{D}^{fr}$, the existence of an encoder partition $\mathcal{P}$ such that $\log |\mathcal{P}| \leq R$ and $D(\mathcal{P}) = D_1^{fr}(R)$, this observation gives the desired result.

For each $k, l \in 1 \cdots K$, let $$c'_{k,l} = \begin{cases} \{n : d(x_n, \mu(c_k)) < d(x_n, \mu(c_l))\} & \text{if } l < k \\ \{n : d(x_n, \mu(c_k)) \leq d(x_n, \mu(c_l))\} & \text{if } l \geq k. \end{cases}$$

Then $d(x, \hat{x}) = \rho(|x - \hat{x}|)$ and $\rho$ non-decreasing imply that the $c'_{k,l}$ are half-lines. For example, if $\rho$ is strictly increasing, then $c'_{k,l} = \{n : x_n < (\mu(c_k) + \mu(c_l))/2\}$ for each $l < k$ and $c'_{k,l} = \{n : x_n \geq (\mu(c_k) + \mu(c_l))/2\}$ for each $l \geq k$. The set $c_k^* = \cap_{l=1}^K c'_{k,l}$ describes all $n \in 1 \cdots N$ for which $\mu(c_k)$ is the closest codeword, with ties broken in favor of the smallest codeword. Since the $c'_{k,l}$ are half-lines, each $c_k^*$ must be an interval. Finally, $\mathcal{P}^* = \{c_k^*\}_{k=1}^K$ partitions $1 \cdots N$ (every $x_n$ has a unique closest codeword) and minimizes expected distortion, giving the desired result. □

We make two modifications in generalizing Theorem 1 from fixed-rate to entropy-constrained codes. First, we consider only points on the convex hull of $\mathcal{D}^{vr}(R)$. Second, we assume $\rho$ is convex. The first constraint is practically motivated since the Lagrangian performance measure used for ECSQ design finds the lower convex hull of $\mathcal{D}^{vr}(R)$; it is also theoretically motivated since there exist points on $\mathcal{D}^{vr}(R)$ (but not on its convex hull) that cannot be achieved with contiguous codecells [5]. In the absence of the second constraint, codecell contiguity may preclude encoder optimality for some source distributions.

*Theorem 2:* Given a pmf $p[1] \cdots p[N]$ and a distortion measure $d(x, \hat{x}) = \rho(|x - \hat{x}|)$ where $\rho : [0, \infty) \to [0, \infty)$ is convex and non-decreasing, any point $(R, D_1^{vr}(R)) \in \mathcal{D}^{vr}$ on the lower convex hull of $D_1^{vr}(\cdot)$ is achievable by an ECSQ with contiguous codecells.

*Proof:* For any point $(R, D_1^{vr}(R)) \in \mathcal{D}^{vr}$, there exists a partition $\mathcal{P}$ with $R(\mathcal{P}) \leq R$ and $D(\mathcal{P}) \leq D_1^{vr}(R)$. We assume without loss of generality that $|\mathcal{P}| \leq N < \infty$ since any partition with more than $N$ codecells must include empty codecells and empty codecells cannot improve ECSQ performance. If $(R, D_1^{vr}(R)) \in \mathcal{D}^{vr}$ is on the lower convex hull of $D_1^{vr}(\cdot)$, then there exists a $\lambda > 0$ such that $\mathcal{P}$ minimizes $D(\mathcal{P}) + \lambda R(\mathcal{P})$ over all partitions on $1\cdots N$, as discussed in Sec. III. Let $\mathcal{P} = \{c_1,\ldots,c_K\}$ ($K \leq N$) with optimal codewords $\mu(c_1) \leq \cdots \leq \mu(c_K)$. We next construct a contiguous codecell partition $\mathcal{P}^* = \{c_k^*\}_{k=1}^K$ that satisfies $\sum_{k=1}^K \sum_{n \in c_k^*} p[n](d(x_n, \mu(c_k)) + \lambda r(c_k)) \leq D(\mathcal{P}) + \lambda R(\mathcal{P})$.

For any $x \in [x_1, x_N]$ and $c \in c_1 \cdots c_K$, let $j(x,c) = d(x, \mu(c)) + \lambda r(c)$. Then for each $k, l \in 1 \cdots K$, let $$c'_{k,l} = \begin{cases} \{n : j(x_n, c_k) < j(x_n, c_l)\} & \text{if } l < k \\ \{n : j(x_n, c_k) \leq j(x_n, c_l)\} & \text{if } l \geq k \end{cases}.$$

From [5, Lem. 1], if $\rho(x)$ is convex and non-decreasing in $x$, then $\rho(|x - \hat{x}_1|) - \rho(|x - \hat{x}_2|)$ is monotonic in $x$. Since $\rho(|x - \hat{x}_1|) - \rho(|x - \hat{x}_2|)$ is monotonic in $x$, $j(x, c_k) - j(x, c_l)$ is monotonic in $x$ for each $(k, l)$. As a result, each non-empty $c'_{k,l}$ is a half line. The set $c_k^* = \cap_{l=1}^K c'_{k,l}$, describes all $n \in 1 \cdots N$ for which $\mu(c_k)$ is the "closest" codeword by this modified nearest neighbor distortion measure, with ties broken in favor of the smallest codeword. Since the $c'_{k,l}$ are half-lines, each $c_k^*$ must be an interval. Again $\mathcal{P}^* = \{c_k^*\}_{k=1}^K$ partitions $1 \cdots N$, and thus we have the desired result. □

If $\rho$ is non-decreasing and not convex, then codecell contiguity may preclude encoder optimality for some source distributions since guaranteeing a unique solution to $\rho(|x - \hat{x}_1|) + \lambda r_1 = \rho(|x - \hat{x}_2|) + \lambda r_2$ requires monotonicity of $\rho(|x - \hat{x}_1|) - \rho(|x - \hat{x}_2|)$ in $x$, which in turn requires convexity of $\rho$, as shown next. For any fixed $a < b$, let $$f(x) = \rho(|x - a|) - \rho(|x - b|)$$
$$= \begin{cases} \rho(a - x) - \rho(b - x) & \text{if } x < a \\ \rho(x - a) - \rho(b - x) & \text{if } a \leq x \leq b \\ \rho(x - a) - \rho(x - b) & \text{if } x > b. \end{cases}$$

If $\rho$ is non-decreasing, then $f(x)$ is non-decreasing for all $x \in [a,b]$. This leaves two possibilities: either $f(x)$ is constant on $[a,b]$ or $f(a) < f(b)$. The first case cannot be true for all $[a,b]$ (that is all codewords) unless $\rho(x) = c$ for all $x$, which is a convex function. In the second case, monotonicity of $f(x)$ requires that $\rho(a - x) - \rho(b - x)$ is non-decreasing for all $x < a$ and that $\rho(x - a) - \rho(x - b)$ is non-decreasing for all $x > b$. The second condition gives $\rho(x - a) - \rho(x - b) \leq \rho(x + \Delta - a) - \rho(x + \Delta - b)$ or $$\rho(x + \Delta - b) - \rho(x - b) \leq \rho(x + \Delta - a) - \rho(x - a)$$

for all $x > b$ and any $\Delta \geq 0$. While achieving this result for some $(a,b)$ does not require the convexity of $\rho$, achieving this result for all $a,b$ requires the convexity of $\rho$. Thus when $\rho$ is not convex, there exists a pmf with optimal codewords $a$ and $b$ such that $f(x)$ is not monotonic. The existence of such a pmf opens the door for an optimal code that requires non-contiguous codecells.

MRSQ, MDSQ, and Restricted MDSQ

We begin by considering the simplest form of (restricted) MDSQ, namely MRSQ. The rate-distortion points achievable by fixed-rate-$R$ and entropy-constrained $M$RSQs are $$\mathcal{D}^{fr}(\underline{R}) = \{(R_i, D(\mathcal{P}_i))|_{i=1}^M : \underline{\mathcal{P}} \in \mathcal{P}^{fr}(\underline{R})\}$$
$$\mathcal{D}^{vr} = \{(R(\mathcal{P}_i|\mathcal{P}_{i-1}), D(\mathcal{P}_i))|_{i=1}^M : \underline{\mathcal{P}} \in \mathcal{P}^{vr}\}$$

respectively, where $$\mathcal{P}^{fr}(\underline{R}) = \{\underline{\mathcal{P}} : \mathcal{P}_M \succeq \cdots \succeq \mathcal{P}_1 \wedge \max_{C \in \mathcal{P}_{i-1}} \log|\mathcal{P}_i(C)| \leq R_i \, \forall i\}$$
$$\mathcal{P}^{vr} = \{\underline{\mathcal{P}} : \mathcal{P}_M \succeq \cdots \succeq \mathcal{P}_1\}.$$

An MRSQ that achieves a point on a lower boundary of $\mathcal{D}^{fr}(\underline{R})$ for any non-negative $\underline{R}$ (here $R_i$ is the incremental rate of resolution $i$) or $\mathcal{D}^{vr}$ is in some sense optimal. (In fixed-rate-$\underline{R}$ coding, each lower boundary describes the minimal value of some $D_j$ subject to constraints on $\{D_i\}_{i \neq j}$. In entropy-constrained coding, each lower boundary describes the minimal value of some $D$, or $R$, subject to constraints on the remaining rates and distortions.) While the lower boundaries are not convex in general, our design technique focuses on achieving points on the lower convex hull of $\mathcal{D}^{fr}(\underline{R})$ and $\mathcal{D}^{vr}$. For any $M$ successively refined partitions $\{\mathcal{P}_m^*\}$ that together achieve a point on the lower convex hull of $\mathcal{D}^{fr}(\underline{R})$, there exists a positive vector $\underline{\nu} = \{\nu_i\}_{i=1}^M$ for which $\{\mathcal{P}_m^*\}$ minimizes the Lagrangian $$J^{fr}(\underline{\mathcal{P}}, \underline{R}, \underline{\nu}) = \sum_{i=1}^M \nu_i D(\mathcal{P}_i)$$

over all $\underline{\mathcal{P}} \in \mathcal{P}^{fr}(\underline{R})$. Similarly, any $M$ successively refined partitions that together achieve a point on the lower convex hull of $\mathcal{D}^{vr}$ minimize the Lagrangian $$J^{vr}(\underline{\mathcal{P}}, \underline{\nu}, \underline{\lambda}) = \sum_{i=1}^M [\nu_i D(\mathcal{P}_i) + \lambda_i R(\mathcal{P}_i|\mathcal{P}_{i-1})]$$

for some positive vectors $\underline{\nu} = \{\nu_i\}_{i=1}^M$ and $\underline{\lambda} = \{\lambda_i\}_{i=1}^M$.

The algorithm described in Section V finds the optimal MRSQ among MRSQs with contiguous codecells *at all resolutions*. That is, the design algorithm considers only MRSQs with contiguous partitions $\mathcal{P}_1, \ldots, \mathcal{P}_M$. Unfortunately, there exist pmfs for which the constraint of codecell contiguity in $\mathcal{P}_1$ precludes optimality even for points on the lower convex hull of $\mathcal{D}^{fr}(\underline{R})$ with $d(x, \hat{x}) = \rho(|x - \hat{x}|)$ and $\rho$ convex. One such example follows

*Example 2:* Let $d(x, \hat{x}) = (x - \hat{x})^2$, and consider pmf $\{1/8, 1/8, 3/8, 3/8\}$ on alphabet $\{20, 40, 60, 140\}$. Then for $M = 2$ there exists a point on the lower convex hull of $\mathcal{D}^{fr}((1,1))$ that cannot be achieved with codecell contiguity. In particular, in order to minimize $D_1$ with $(R_1, R_2) = (1,1)$ and $D_2 = 0$, we must use non-contiguous codecells at resolution 1. The optimal partitions (in terms of the symbol alphabet rather than the symbol indices) are $\mathcal{P}_1 = \{\{20,60\}, \{40,140\}\}$ and $\mathcal{P}_2 = \{\{20\}, \{60\}, \{40\}, \{140\}\}$. Figure 9 shows the corresponding optimal 2RSQ codebook.

The same problem can arise for entropy-constrained MRSQs achieving performance on the lower convex hull of $\mathcal{D}^{vr}$, as shown in Example 3.

*Example 3:* Consider $M = 2$, $d(x, \hat{x}) = (x - \hat{x})^2$, pmf $\{1/8, 3/8, 1/8, 3/8\}$, and alphabet $\{20, 40, 60, 80\}$. If $\lambda_2 + 31.36\nu_1 < \lambda_1 < \lambda_2 + 5951.16\nu_1$ and $\nu_2$ is sufficiently large to force $D_2$ to 0, then achieving the optimal performance requires non-contiguous codecells at resolution 1. The optimal partitions (in terms of the symbol alphabet rather

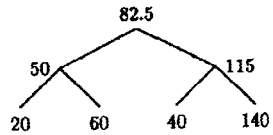

Fig. 9. An optimal fixed-rate 2RSQ codebook for which $\mathcal{P}_1$ requires non-contiguous codecells. Given pmf $\{1/8, 1/8, 3/8, 3/8\}$ on alphabet $\{20, 40, 60, 140\}$, the optimal 2RSQ for all $\nu_1, \nu_2$ such that $\nu_1/\nu_2 < .02695$ must have non-contiguous codecells at resolution 1. The codebook's resolution-1 partition is $\mathcal{P}_1 = \{\{20,60\}, \{40,140\}\}$ with $\mu(\{20,60\}) = 50$ and $\mu(\{40,140\}) = 115$.

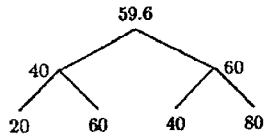

Fig. 10. An optimal entropy-constrained 2RSQ codebook with non-contiguous codecells in $\mathcal{P}_1$. Given pmf $\{1/8, 3/8, 1/8, 3/8\}$ on alphabet $\{20, 40, 60, 80\}$, the optimal 2RSQ for all $(\lambda_1, \lambda_2, \nu_1, \nu_2)$ such that $\lambda_2 + 31.36\nu_1 < \lambda_1 < \lambda_2 + 5951.16\nu_1$ and $\nu_2$ is sufficiently large to force $D_2$ to 0 must have non-contiguous codecells at resolution 1. Here $\mathcal{P}_1 = \{\{20,60\}, \{40,80\}\}$ with $\mu(\{20,60\}) = 40$, $\mu(\{40,80\}) = 60$, $R(\mathcal{P}_1) = .1414$, and $R(\mathcal{P}_2|\mathcal{P}_1) = 1$.

than the symbol indices) are $\mathcal{P}_1 = \{\{20,60\},\{40,80\}\}$ and $\mathcal{P}_2 = \{\{20\},\{60\},\{40\},\{80\}\}$. Figure 10 shows the optimal 2RSQ codebook.

Since MRSQ is a special case of a restricted MDSQ, the above observations that the assumption of codecell contiguity precludes optimality in fixed-rate and entropy-constrained MRSQ for some source distributions and some Lagrangian parameters generalize to MDSQ and restricted MDSQ as well. The result is the following theorem.

*Theorem 3:* Requiring codecell contiguity in partition $\mathcal{P}_1$ of a fixed-rate or entropy-constrained $M$RSQ, $M$DSQ, or restricted $M$DSQ with $M > 1$ precludes optimality for some finite-alphabet sources, even when $d(x, \hat{x}) = \rho(|x - \hat{x}|)$ with $\rho : [0, \infty) \to [0, \infty)$ non-decreasing and convex.

Examples such as the ones given above prove the theorem. Due to the popularity of the squared error distortion measure for practical coding applications, Examples 2 and 3 treat the case where $d(x, \hat{x}) = (x - \hat{x})^2$. We can construct similar examples for other distortion measures.

While Theorem 3 and the examples that precede it demonstrate the problem with assuming codecell contiguity at the *coarsest* level partition ($\mathcal{P}_1$), there exist distortion measures for which the assumption of codecell contiguity at the finest partition ($\mathcal{P}_M$ in an $M$RSQ) level does not preclude optimality. Theorem 4 proves this result for fixed-rate MRSQ with the squared-error distortion measure. The same argument extends immediately to entropy-constrained MRSQ and fixed-rate and entropy-constrained MDSQ and restricted MDSQ.

*Theorem 4:* Given pmf $p[1] \cdots p[N]$ and distortion measure $d(x,\hat{x}) = (x - \hat{x})^2$, any point $(\underline{R}, \underline{D}) \in \mathcal{D}^{fr}(\underline{R})$ that sits on the lower convex hull of $\mathcal{D}^{fr}(\underline{R})$ is achievable by a fixed-rate MRSQ with contiguous codecells in $\mathcal{P}_M$.

*Proof:* For any point $(\underline{R}, \underline{D}) \in \mathcal{D}^{fr}(\underline{R})$ on the lower convex hull of $\mathcal{D}^{fr}(\underline{R})$, $(\underline{R}, \underline{D}) \in \mathcal{D}^{fr}(\underline{R})$ implies the existence of partitions $\underline{\mathcal{P}} \in \mathcal{P}^{fr}(\underline{R})$ with $D(\mathcal{P}_i) = D_i$ for each $i \in 1 \cdots M$. Further, since $(\underline{R}, \underline{D})$ is on the lower convex hull of $\mathcal{D}^{fr}(\underline{R})$, there exists a non-negative vector $\nu^M$ for which $\underline{\mathcal{P}}$ minimizes $\sum_{i=1}^{M} \nu_i D(\mathcal{P}_i)$ over all $\underline{\mathcal{P}} \in \mathcal{P}^{fr}(\underline{R})$. Label the codecells of each partition in $\underline{\mathcal{P}}$ as $\mathcal{P}_i = \{c_{i,1}, \ldots, c_{i,K(i)}\}$ ($K(i) \leq 2^{R_i}$) with optimal codewords $\mu(c_{i,1}), \ldots, \mu(c_{i,K(i)})$ for each $i \in 1 \cdots M$. Without loss of generality, index the codecells of $\mathcal{P}_M$ so that $\mu(c_{M,1}) \leq \mu(c_{M,2}) \leq \cdots \leq \mu(c_{M,K(M)})$. Since $\mathcal{P}_{i+1}$ refines $\mathcal{P}_i$ for each $i \in 1 \cdots M - 1$, let $a(i, k)$ denote the index of the resolution-$i$ codecell from which codecell $c_{M,k}$ descends. (Here $i \in 1 \cdots M$ and $a(M, k) = k$ for all $k \in 1 \cdots K(M)$.) We next construct partitions $\underline{\mathcal{P}}^* \in \mathcal{P}^{fr}(\underline{R})$ so that $\mathcal{P}_M^*$ has contiguous codecells and the expected Lagrangian performance based on $\underline{\mathcal{P}}^*$ is no worse than that based on $\underline{\mathcal{P}}$.

For any $x \in [x_1, x_N]$ and any $c_{M,k}$ with $k \in 1 \cdots K(M)$, let $j(x, c_{M,k}) = \sum_{i=1}^{M} \nu_i d(x, \mu(c_{i,a(i,k)}))$. Then for each $k, l \in 1 \cdots K$, let $$c'_{k,l} = \begin{cases} \{n : j(x_n, c_{M,k}) < j(x_n, c_{M,l})\} & \text{if } l < k \\ \{n : j(x_n, c_{M,k}) \leq j(x_n, c_{M,l})\} & \text{if } l \geq k \end{cases}$$

Since $d(x, \hat{x}) = (x - \hat{x})^2$, the difference $j(x, c_{M,k}) - j(x, c_{M,l})$ is linear in $x$ for all $k \neq l$ (the quadratic terms cancel). As a result, each non-empty $c'_{k,l}$ is a half line, and the set $c^*_{M,k} = \cap_{l=1}^{K} c'_{k,l}$ describes all $n \in 1 \cdots N$ for which $\{\mu(c^*_{i,a(i,k)})\}_{i=1}^{M}$ is the $M$-resolution reproduction with the best Lagrangian performance. (Ties are broken in favor of the smallest resolution-$M$ codeword.) Since the $c'_{k,l}$ are half-lines, each $c^*_{M,k}$ must be an interval. The partition $\mathcal{P}_M^* = \{c^*_{M,k}\}_{k=1}^{M}$ together with the ancestor relationships described by $a(\cdot, \cdot)$ describe a partition $\underline{\mathcal{P}}^* \in \mathcal{P}^{fr}(\underline{R})$ with $\mathcal{P}_i^* = \{c^*_{i,k}\}_{k=1}^{K(i)}$ and $c^*_{i,k} = \cup_{k' \in 1 \cdots K(M): a(i, k') = k} c^*_{M, k'}$. (Here $|\mathcal{P}_i^*| = |\mathcal{P}_i|$ for all $i$ by construction.) Since $\underline{\mathcal{P}}$ minimizes the Lagrangian performance with respect to the given codebook, $$\sum_{k=1}^{K(M)} \sum_{n \in c^*_{M,k}} p[n] \sum_{i=1}^{M} \nu_i d(x_n, \mu(c_{i,a(i,k)})) \leq \sum_{i=1}^{M} \nu_i D(\mathcal{P}_i),$$

giving the desired result. □

Side-Information Codes

Unfortunately, the codecell contiguity constraint can also degrade the performance of codes with decoder side-information. This problem can occur even in simple fixed-rate SQ with $d(x, \hat{x}) = \rho(|x - \hat{x}|)$ for a well-behaved function $\rho$. The following example illustrates the problem.

*Example 4:* Consider $M = 2$, $d(x, \hat{x}) = (x - \hat{x})^2$, pmf $\{1/4, 1/4, 1/4, 1/4\}$, and alphabet $\{20, 40, 60, 80\}$. Suppose that the side-information takes on values from $\{1, 2\}$ with $\Pr(1|X = 20) = \Pr(1|X = 40) = \Pr(2|X = 60) = \Pr(2|X = 60) = 0.999$. The side-information is available only to the decoder. Then the optimal fixed-rate-1 SQ with decoder side-information requires non-contiguous codecells. In particular, $\mathcal{P} = \{\{20, 60\}, \{40, 80\}\}$.

*Theorem 5:* Requiring codecell contiguity in fixed-rate or variable-rate SQ, MRSQ, MDSQ, or restricted MDSQ with decoder side-information precludes optimality for some finite-alphabet sources, even when $d(x, \hat{x}) = \rho(|x - \hat{x}|)$ with $\rho : [0, \infty) \to [0, \infty)$ non-decreasing and convex.

REFERENCES

[1] J. D. Bruce, *Optimum Quantization*, Ph.D. thesis, M.I.T., Cambridge, MA, May 1964.
[2] D. K. Sharma, "Design of absolutely optimal quantizers for a wide class of distortion measures," *IEEE Transactions on Information Theory*, vol. IT-24, no. 6, pp. 693–702, Nov. 1978.
[3] X. Wu, *Algorithmic approach to mean-square quantization*, Ph.D. thesis, University of Calgary, 1988.
[4] X. Wu and K. Zhang, "Quantizer monotonicities and globally optimal scalar quantizer design," *IEEE Transactions on Information Theory*, vol. IT-39, no. 3, pp. 1049–1053, May 1993.
[5] A. György and T. Linder, "On the structure of optimal entropy-constrained scalar quantizers," *IEEE Transactions on Information Theory*, vol. 48, no. 2, pp. 416–427, February 2002.
[6] P. A. Chou, T. Lookabaugh, and R. M. Gray, "Entropy-constrained vector quantization," *IEEE Transactions on Acoustics Speech and Signal Processing*, vol. 37, no. 1, pp. 31–42, January 1989.
[7] P. A. Chou and T. Lookabaugh, "Locally optimal variable-to-variable length source coding with respect to a fidelity criterion," in *Proceedings of the IEEE International Symposium on Information Theory*, Budapest, Hungary, June 1991, p. 238.
[8] M. Effros, P. A. Chou, and R. M. Gray, "Variable dimension weighted universal vector quantization and noiseless coding," in *Proceedings of the Data Compression Conference*, Snowbird, UT, Mar. 1994, IEEE, pp. 2–11.
[9] Z. Xiong, C. Herley, K. Ramchandran, and M. T. Orchard, "Flexible time segmentations for time-varying wavelet packets," *IEEE Transactions on Signal Processing*, vol. 3, no. 1, pp. 9–12, Jan. 1994.
[10] P. Prandoni, M. Goodwin, and M. Vetterli, "Optimal time segmentation for signal modeling and compression," in *Proceedings of the IEEE International Conference on Acoustics, Speech, and Signal Processing*, Munich, Germany, Apr. 1997, vol. 3, pp. 2029–2032.
[11] G. M. Schuster and A. K. Katsaggelos, "An optimal segmentation encoding scheme in the rate distortion sense," in *Proceedings of the IEEE International Symposium on Circuits and Systems*, Atlanta, May 1996, vol. 2, pp. 640–643.
[12] T. H. Cormen, C. E. Leiserson, and R. L. Rivest, *Introduction to Algorithms*, The MIT Press, McGraw-Hill Book Company, 1990.
[13] S. Herman and K Zeger, "Variable fanout trimmed tree-structured vector quantization for multirate channels," in *Proceedings of the IEEE International Symposium on Information Theory and Its Applications*, Victoria, British Columbia, Canada, Sept. 1996, vol 1, pp 417–421.
[14] H Brunk and N. Farvardin, "Fixed-rate successively refinable scalar quantizers," in *Proceedings of the Data Compression Conference*, Snowbird, UT, Apr. 1996, IEEE, pp. 250–259
[15] H. Jafarkhani, H Brunk, and N Farvardin, "Entropy-constrained successively refinable scalar quantization," in *Proceedings of the Data Compression Conference*, Snowbird, UT, Mar. 1997, IEEE, pp 337–346
[16] M Effros, "Practical multi-resolution source coding TSVQ revisited," in *Proceedings of the Data Compression Conference*, Snowbird, UT, Mar. 1998, IEEE, pp 53–62
[17] V A Vaishampayan, "Design of multiple description scalar quantizers," *IEEE Transactions on Information Theory*, vol 39, no 3, pp 821–834, May 1993
[18] V A Vaishampayan and J Domaszewicz, "Design of entropy-constrained multiple description scalar quantizers," *IEEE Transactions on Information Theory*, vol 40, no. 1, pp 245–250, Jan 1994
[19] R M Gray and A D Wyner, "Source coding for a simple network," *Bell System Technical Journal*, vol. 53, no. 9, pp. 1681–1721, November 1974.
[20] D. Slepian and J. K. Wolf, "Noiseless coding of correlated information sources," *IEEE Transactions on Information Theory*, vol. 19, pp. 471–480, 1973.

What is claimed is:

1. A signal encoding system having a coder for encoding signals, the coder including a scalar quantizer and a lossless coder, the scalar quantizer producing a distortion on the signals to be encoded, wherein the scalar quantizer is globally optimal quantizer under a rate/distortion tradeoff, so that the distortion is minimized when the rate of the optimal quantizer is no larger than a specified value.

2. The signal encoding system of claim 1, wherein the scalar quantizer is a variable rate quantizer.

3. The signal encoding system of claim 1, wherein the signal encoding system is a communications system and the encoded signals are transmitted along a channel.

4. The signal encoding system of claim 1, further comprising a storage device for storing the encoded signals.

5. The signal encoding system of claim 1, wherein the scalar quantizer is a single-description scalar quantizer.

6. The signal encoding system of claim 1, wherein the scalar quantizer is a multiple-description scalar quantizer.

7. The signal encoding system of claim 6, wherein the scalar quantizer is a multi-resolution scalar quantizer.

8. A signal decoding system having a decoder for decoding signals, the decoder including a lossless decoder and an inverse scalar quantizer wherein the inverse scalar quantizer is globally optimal quantizer under a rate/distortion tradeoff, so that the distortion is minimized when the rate of the optimal quantizer is no larger than a specified value.

9. The signal decoding system of claim 8, wherein the inverse scalar quantizer is a variable rate inverse scalar quantizer.

10. The signal decoding system of claim 8, wherein the data decoding system is a communications system and the decoded signals are received through a channel.

11. The signal decoding system of claim 8, further comprising a storage device for storing the decoded signals.

12. The signal decoding system of claim 8, wherein the inverse scalar quantizer is a single-description scalar quantizer.

13. The signal decoding system of claim 8, wherein the inverse scalar quantizer is a multiple-description scalar quantizer.

14. The signal decoding system of claim 13, wherein the inverse scalar quantizer is a multi-resolution scalar quantizer.

15. A signal encoding method for use in a signal encoding system, comprising the steps of:

providing a source alphabet containing a set of source characters;

approximating the set of source characters by designing a scalar quantizer and applying the designed scalar quantizer to the set of source characters, thus producing a smaller set of characters and a distortion on the set of source characters; and applying a compression algorithm to the smaller set of characters, wherein the step of designing a scalar quantizer comprises the steps of:
defining a target function depending on the distortion on the set of source characters; and
minimizing the target function to obtain a globally optimal quantizer.

16. The method of claim 15, wherein the target function also depends on the number of bits describing a source character in the encoding method.

17. The method of claim 16, wherein the minimized target function is optimal under a rate/distortion tradeoff, the rate being the number of bits describing a source character in the encoding method.

18. The method of claim 17, wherein the step of minimizing the target function comprises the steps of:

dividing the rate into a sum of partial rates; and dividing the distortion into a sum of partial distortions.

19. The method of claim 15, wherein the step of minimizing the target function comprises the step of building a graph.

20. The method of claim 19, wherein the target function is minimized by applying a shortest path algorithm to the graph.

21. The method of claim 20, wherein the shortest path algorithm is a single-source shortest path algorithm.

22. The method of claim 20, wherein the shortest path algorithm is an all-pairs shortest path algorithm.

23. The method of claim 20, wherein the shortest path algorithm is an optimal segmentation algorithm.

24. The method of claim 20, wherein the step of applying the shortest path algorithm is applied to a partial rate-distortion graph.

25. The method of claim 19, wherein the graph is a weighted directed acyclic graph.

26. The method of claim 15, wherein the step of approximating the set of source characters comprises the step of obtaining a partition of the source alphabet.

27. The method of claim 15, further comprising a step of preprocessing the source alphabet before the step of approximating the source alphabet.

28. The method of claim 15, wherein the target function is minimized by means of dynamic programming.

29. A client-server system comprising a server and a plurality of clients, wherein when a client of the plurality of clients requests data to the server, the server provides the client with an approximation of the requested data, the approximation being based on a quantization process of the requested data, thus producing distortion on the requested data, the quantization process approximating the requested data to a smaller number of data and comprising a step of designing a scalar quantizer by defining a target function and minimizing the target function to obtain a globally optimal quantizer.

30. The system of claim 29, wherein the minimized target function is optimal under a rate/distortion tradeoff, the rate depending on the smaller number of data.

31. The system of claim 29, wherein the step of minimizing the target function comprises the step of building a graph.

32. The system of claim 31, wherein the target function is minimized by applying a shortest path algorithm to the graph.

33. The system of claim 31, wherein the step of minimizing the target function is performed by means of dynamic programming.

* * * * *